US00RE36431E

United States Patent [19]

Muro et al.

[11] E Patent Number: Re. 36,431

[45] Reissued Date of Patent: Dec. 7, 1999

[54] SEMICONDUCTOR LASER ELEMENT AND LASER DEVICE USING THE SAME ELEMENT

[75] Inventors: Kiyofumi Muro; Tsuyoshi Fujimoto, both of Sodegaura; Yuji Yoshida, Kuga-gun; Yoshikazu Yamada, Sodegaura; Shoji Ishizaka, Ichihara, all of Japan

[73] Assignee: Mitsui Chemicals, Inc., Tokyo, Japan

[21] Appl. No.: 08/971,106

[22] Filed: Nov. 14, 1997

Related U.S. Patent Documents

Reissue of:

[64] Patent No.: 5,467,364
Issued: Nov. 14, 1995
Appl. No.: 08/287,802
Filed: Aug. 9, 1994

U.S. Applications:

[63] Continuation-in-part of application No. 08/129,147, Oct. 5, 1993, abandoned.

[30] Foreign Application Priority Data

Feb. 5, 1992 [JP] Japan ..... 4-20289

[51] Int. Cl.[6] ..... H01S 3/19

[52] U.S. Cl. ..... 372/45

[58] Field of Search ..... 372/44, 45, 46

[56] References Cited

U.S. PATENT DOCUMENTS

| | | | |
|---|---|---|---|
| 4,328,469 | 5/1982 | Scifres et al. | 372/45 |
| 5,172,384 | 12/1992 | Goronkin et al. | 372/45 |
| 5,319,660 | 6/1994 | Chen et al. | 372/45 |

FOREIGN PATENT DOCUMENTS

| | | |
|---|---|---|
| 348941 | 1/1990 | European Pat. Off. . |
| 56-164588 | 12/1981 | Japan . |
| 58-216489 | 12/1983 | Japan . |
| 60-133781 | 7/1985 | Japan . |
| 60-164379 | 8/1985 | Japan . |
| 61-15385 | 1/1986 | Japan . |
| 62-74517 | 4/1987 | Japan . |
| 62-173788 | 7/1987 | Japan . |
| 62-188392 | 8/1987 | Japan . |
| 2150087 | 6/1990 | Japan . |
| 3-071679 | 3/1991 | Japan . |
| 3-076288 | 4/1991 | Japan . |
| 3-290984 | 12/1991 | Japan . |

OTHER PUBLICATIONS

Applied Optics, vol. 19, No. 17, New York, pp. 2940–2941, Sep. 1980.

Casey et al, Heterostructure Lasers, Part A Fundamental Principles, Academic Press, New York pp. 31–57, 1978.

Tsang, A New–Current Injection Heterostructure Laser: The Double Barrier . . . , Applied Physics Letter 38 (11), Jun. 1981.

Yamada, Optimum Structure of a Potential Controlled Low Threshold Laser, Transactions of the IEICE, vol. E, 71, No. 6, Jun. 1988.

*Primary Examiner*—James W. Davie
*Attorney, Agent, or Firm*—Sherman and Shalloway

[57] ABSTRACT

A semiconductor laser of this invention, having a structure of an element composed of: carrier block layers, formed bilaterally externally of an active layer in section which is formed in the vertical direction from the surface of the element, for reducing a light guiding function of the active layer; wave guide layers provided bilaterally externally of said carrier block layers and clad layers provided so that the wave guide layers are sandwiched in between the clad layers. This invention overcomes a dilemma inherent in the conventional weakly guiding laser and LOC structured laser in terms of designing the device for controlling a guided mode. The present invention also solves the problems in terms of attaining higher outputting and a low dispersion of the radiation beams and improving a beam profile.

12 Claims, 32 Drawing Sheets

VIEW OF ACTIVE LAYER ENERGY BAND

BANDGAP
(A1 COMPOSITION IN
GaA1As SYSTEM)
REFRACTIVE
INDEX
1
2
3
4
5
6
7

BANDGAP
(A1 COMPOSITION IN
GaA1As SYSTEM)
REFRACTIVE
INDEX

BANDGAP
(A1 COMPOSITION IN
GaA1As SYSTEM)
REFRACTIVE
INDEX
ENLARGED
VIEW

VIEW OF ACTIVE LAYER ENERGY BAND

VIEW OF ACTIVE LAYER ENERGY BAND

VIEW OF ACTIVE LAYER ENERGY BAND

VIEW OF ACTIVE LAYER ENERGY BAND

VIEW OF ACTIVE LAYER ENERGY BAND

VIEW OF ACTIVE LAYER ENERGY BAND

VIEW OF ACTIVE LAYER ENERGY BAND

VIEW OF ACTIVE LAYER ENERGY BAND

VIEW OF ACTIVE LAYER ENERGY BAND

VIEW OF ACTIVE LAYER ENERGY BAND

VIEW OF ACTIVE LAYER ENERGY BAND

VIEW OF ACTIVE LAYER ENERGY BAND

VIEW OF ACTIVE LAYER ENERGY BAND

VIEW OF ACTIVE LAYER ENERGY BAND

VIEW OF ACTIVE LAYER ENERGY BAND

VIEW OF ACTIVE LAYER ENERGY BAND

VIEW OF ACTIVE LAYER ENERGY BAND

VIEW OF ACTIVE LAYER ENERGY BAND

VIEW OF ACTIVE LAYER ENERGY BAND

GUIDED MODE

RADIATION MODE

GUIDED MODE

GUIDED MODE

RADIATION MODE

GUIDED MODE

RADIATION MODE

FIG.31 (AMENDED)
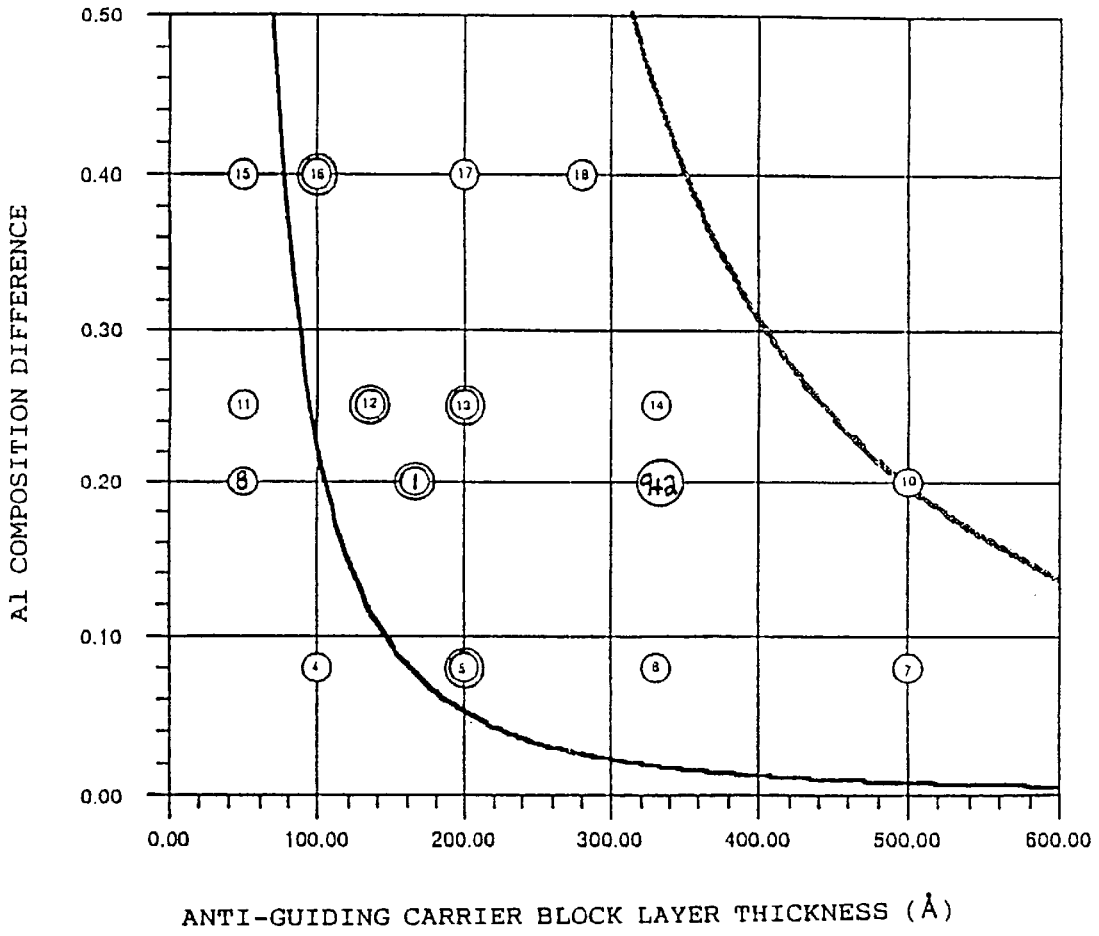

SEMICONDUCTOR LASER ELEMENT AND LASER DEVICE USING THE SAME ELEMENT

Matter enclosed in heavy brackets [ ] appears in the original patent but forms no part of this reissue specification; matter printed in italics indicates the additions made by reissue.

This application is a continuation-in-part of applicants' parent application Ser. No. 08/129,147 filed Oct. 5, 1993, now abandoned, which parent application is incorporated herein in its entirety by reference thereto.

TECHNICAL FIELD

The present invention relates generally to industrial fields in which high-output semiconductor lasers are employed for communications, optical recording on optical disks or the like, laser printers, laser medical treatments, laser machining, etc. The present invention relates, more particularly, to a high-output semiconductor laser for a solid-state laser excitation requiring laser beams having an enhanced output and a small radiation angle or for a harmonic conversion element excitation and also to a laser device using this semiconductor laser.

BACKGROUND ARTS

It has been desired in many sectors that the output of the semiconductor laser be enhanced. A factor for hindering the output enhancement per single mode of the semiconductor laser is an exit surface fusion caused by the laser beam which is called catastrophic optical damage (COD). The COD is conspicuous especially in an AlGaAs laser. Paying attention mainly to a reduction of a power density of the laser by expanding a laser guided mode, a weakly guiding laser having a thin active layer or a separate confinement type laser known as a large optical cavity (LOC) structure has hitherto been examined.

Based on such a structure, however, a strong correlation exists between a refractive index and a bandgap of each mixed crystal in a variety of laser materials ranging from the AlGaAs system. It is therefore impossible to independently control a carrier confinement and an optical confinement in a waveguide.

In particular, the expansion of the guided mode requires the thin active layer in either the LOC structured laser or the weakly guiding laser for the output enhancement. Further, a wide active layer is needed for obtaining a high gain for oscillations in the expanded guided mode. A self-contradiction thus exists therein. As a matter of fact, a limit of the mode expansion in an epitaxial direction by the above-mentioned methods is approximately 1 $\mu$m at the maximum. A limit of the output is on the order of 100 mW per single mode.

Besides, in the weakly guiding laser having the thin active layer, the guided mode in the laminated direction exhibits an exponential function profile. Hence, a radiation density in the active layer where the catastrophic optical damage is caused is high as compared with the whole beam intensity. This is disadvantageous for the output enhancement. Besides, the guided mode has tails drawn deeply in the clad layers, and hence there is needed a growth of the clad layers that is considerably thick for the expansion of the guided mode.

In addition, both the guided mode (near-field pattern) and a beam radiation angle (far-field pattern) deviate largely from the Gaussian beam conceived as ideal one. There exists a problem in terms of a convergence of the beams in multiple applications.

On the other hand, there have also been examined lasers based on a so-called window structure in which the vicinity of an exit surface where a COD may occur is made transparent to the laser emission beam and a structure where a carrier injection is not effected in the vicinity of the exit surface. Those structures generally present, however, such problems that the astigmatism increases in addition to a complicated manufacturing process.

Further, there has been made an attempt to manufacture the high-output laser in the single mode by an optical feedback between a multiplicity of semiconductor lasers. The problem is, however, that the device becomes complicated.

It is an object of the present invention in view of the fact that multi-layered thin films have been easily formed by the molecular beam epitaxial (MBE) method, the metal organic chemical vapor deposition (MOCVD) method, etc. in recent years to solve the problems inherent in the conventional weakly guiding lasers and the LOC structured lasers in terms of overcoming the dilemma in designing the device for controlling the guided mode, attaining the output enhancement, the low dispersion of the radiation beams and improving the beam profile.

DISCLOSURE OF THE INVENTION

According to the present invention, barrier layers (hereinafter referred to as "carrier block layers") having barrier heights and widths enough to cancel a guiding characteristic of an active layer and perform a carrier confinement in the active layer are inserted on both sides of the active layer of an ordinary double hereto laser or a quantum well laser. It is therefore possible to perform the confinement in the guided mode and independently design an active layer thickness required for oscillations.

On this occasion, a guiding function of the active layer can be cancelled by the carrier block layers by reducing the thickness of the active layer region and the thickness of the carrier block layers to $1/N^{th}$ (N=2 to 9) or less of the oscillation wavelength. Under such conditions, the wave guide layers are further formed, and clad layers having a small difference of refractive index are formed at both sides of the wave guide layer for the purpose of controlling only light guiding. Formed alternatively are wide wave guide layers based on a graded-index structure of a straight line, a quadratic curve, etc. It is thus possible to design the guided mode completely independently of the active layer design parameters, thereby obtaining a stable mode approximate to the Gaussian beams and the radiation beams having the high output and low dispersion angle.

With the intention of enhancing the output of the semiconductor laser by avoiding the [concurrent] *catastrophic* optical damage on the exit surface and of decreasing a divergence angle of the beam radiation, it is required that the guided mode be expanded by setting to so-called weakly guiding. The optical gain in the active layer, however, has a certain limit as seen in the gain saturation of, e.g., the quantum well laser. For this reason, the wide active layer or multi-quantum well structure are required for maintaining the oscillations in the expanded guided mode. This induces the self-contradiction with the weakly guiding structure and therefore causes a problem in terms of designing a laser diode having a high-output and a low radiation beam angle.

The number of the quantum wells and the thickness of the active layer for giving the necessary optical gain to the oscillations can be set independently from the wave guide structure because of the existence of the carrier block layers incorporating the anti-guiding function described above. Particularly, the guiding function of the active layer region is cancelled by the anti-guiding function of the carrier block layers. The design of the active layer is compatible with the design of the guided mode by further separately introducing, into the wave guide layer a mechanism for controlling the guided mode, as illustrated in FIGS. 1-(a), 1-(b) and 1-(c), a refractive index distribution of a stepped, straight line or quadratic curve. It is therefore feasible to obtain the stable wave guide mode approximate to the Gaussian beams having the high-output, and low beam divergence.

The present invention can be readily actualized by use of the thin film semiconductor manufacturing equipment such as a molecular beam epitaxial (MBE) system, a metal organic chemical vapor deposition (MOCVD) system or a metal organic molecular beam epitaxial (MOMBE) system. Further, the effects of this invention are remarkable in the laser diode using AlGaAs alloy. Substantially the same effects can be, however, expected in a variety of III-V group semiconductor materials of a GaInAs system, an AlGaInAs system, a GaInAs system and a AlGaInP system and further in various types of II-VI group semiconductor lasers.

As illustrated in FIG. 1, the carrier block layers are interposed on both sides of the active layer of the laser based on the conventional double hereto type structure of a multiple quantum well structure. The carrier block layers are composed of materials having a barrier height high enough to effect a carrier confinement in the active layer, i.e., a smaller refractive index and a wider gap than that of the wave guide layer. The carrier block layers also incorporate the function to cancel the guiding characteristic of the active layer, the anti-guiding function and the carrier block function.

Further, it is possible to reduce a resistance due to the formation of a Schottky barrier on a band discontinuous surface and perform effective carrier blocking by performing P-doping on the order of $10^{18}/cm^3$ on the P-side of the carrier block layer and N-doping on the N-side, as shown in FIG. 2.

The cancellation of the guiding function of the active layer region by the carrier block layers having the anti-guiding function can be substantially attained when establishing the following relationship under such condition that a thickness of both is $1/N^{th}$ (N=2 to 9) or less of the oscillation wavelength:

$$d_0\cdot(N_1^2-N_0^2)^{0.5}=2\cdot d_1(N_0^2-N_2^2)^{0.5}$$

where, as substantially shown in FIG. 1, $N_0$ is the refractive index of the wave guide layer, $N_1$, $d_0$ are respectively the refractive index and the thickness of the active layer, and $N_2$, $d_1$ are respectively the refractive index and the thickness of the carrier block layers. If the active layer is multi-layered as seen in the multiple quantum well structure, a quantity corresponding to the left side is calculated with respect to each layer. An added value may be employed for the left side. More specifically, in the case of the active layer composed of the m quantum well layers having a thickness $d_w$ wherein a composition of the barrier layers between the quantum wells is the same as that of the wave guide layer, the guiding function of the active layer can be cancelled by the [barrier] *carrier block* layer when establishing the following relationship $$m\cdot d_w\cdot(N_1^2-N_0^2)^{0.5}=2\cdot d_1(N_0^2-N_2^2)^{0.5}.$$

When the guiding function of the active layer is cancelled by the carrier block layers, the guided mode is independently controllable by clad layers and the wave guide layers provided therearound. It is desirable that the wave guide is cut off with respect to a higher-order mode for the single mode oscillations in any of the structures shown in FIGS. 1-(a), 1-(b) and 1-(c). Speaking of a step index type guiding mechanism shown in FIG. 1(a), this guided mode can be described by the normalized frequency V. The normalized frequency V is defined by the following formula:

$$V=(\pi d/\lambda)\cdot(N_0^2-N_3^2)^{0.5}$$

where $\pi$ is the ratio of the circumference of a circle to its diameter, $\lambda$ is the oscillation wavelength, d is the effective thickness of the wave guide layer including the active layer and the carrier block layer, $N_0$ is the effective refractive index of the wave guide layer, and $N_3$ is the refractive index of the clad layer. If the refractive index of the wave guide layer continuously changes, the maximum value of $N_0$ is used.

In a symmetric waveguide, when the normalized frequency V is $\pi/2$ or under, single mode guiding is effected. Note that guided mode exhibits a profile of a sinusoidal function within the wave guide layer but a profile of an exponential function within the clad layers. When $V=\pi/2$, a mode confinement rate in the wave guide layer is approximately 65%. Unlike the profile of the exponential function over the substantially entire area of the conventional weakly guiding laser, the guided mode approximates the Gaussian type (see FIG. 21). The structures (shown in FIGS. 2 and 3, respectively) in the embodiments 1 and 2 are designed substantially under this condition.

In the approximate-to-symmetry guiding structure, there is almost no possibility in which an odd-order mode is excited. Hence, even when making the mode more approximate to the Gaussian type by further increasing the normalized frequency V up to a level of $\pi$, the same effects can be acquired without causing multiple transverse mode oscillations. The embodiment 3 having the structure shown in FIG. 4 gives a design example where V is approximate to $\pi$.

More effectively, the oscillation mode can be made approximate to the Gaussian type by adopting the graded-index structure as shown in FIGS. 1-(b) and 1-(c).

We have repeated a trial manufacture of the semiconductor laser on the basis of the above-mentioned as a guideline and could obtain the following conditions with respect to the carrier block layer, $V_0$ is defined by:

$$V_0=d_0/\lambda(N_1^2-N_0^2)^{0.5}$$

where $\pi$ is the ratio of the circumference of a circle to its diameter, $d_0$ is the thickness of the active layer, $\lambda$ is the oscillation wavelength and $N_1$ is the refractive index of the active layer and $N_0$ is the refractive index of the wave guide layer. If the active layer consists of [N-]*m*-pieces of multiple quantum wells, $V_0$ is expressed such as:

$$[V_0=N\cdot\pi\cdot d_w/\lambda\cdot(N_1^2)^{0.5}]\ V_0=m\cdot\pi\cdot d_w/\lambda\cdot(N_1^2)^{0.5}$$

where $d_w$ is the thickness of the well layer, $N_1$ is the refractive index of the well layer, and $N_0$ is the refractive index of the wave guide layer.

Next, $V_1$ is defined by:

$$V_1=(\pi\cdot d_1/\lambda)\cdot(N_0^2-N_2^2)^{0.5}$$

where $\pi$ is the ratio of the circumference of a circle to its diameter, $d_1$ is the thickness of the carrier block layers, $N_2$ is the refractive index of the carrier block layers, and $N_0$ is the refractive index of the wave guide layer.

Next, $V_2$ is defined by:

$$V_2=(\pi d_2/\lambda)\cdot(N_0^2-N_3^2)^{0.5}$$

where $\pi$ is the ratio of the circumference of a circle to its diameter, $d_2$ is the effective thickness between the two clad layers, i.e., effective wave guide layer thickness, $N_0$ is the effective refractive index of the wave guide layer, and $N_3$ is the refractive index of the clad layer.

The effective thickness between the two clad layers $d_2$ is defined as follows:

$$d_2 = \frac{1}{N_w^m - N_3}\int_{x_1}^{x_2}(N_w(x) - N_3)dx$$

$N_w^m$ is the maximum refractive index of the wave guide layer and $N_w(x)$ is the refractive index of wave guide at the position; x, $x_1$, $x_2$ are the boundary between the wave guide layer and the lower or upper clad layer, respectively. [The effective refractive index $N_0$ is a maximum value of the wave guide layer.]

As obvious from the formulas described above, $V_0$, $V_1$, $V_2$ respectively correspond to the normalized frequencies of the active layer, the carrier block layers and the wave guide layer. If the anti-guiding function of the carrier block layers is too large, a reentrant is formed in the vicinity of the active layer in the guided mode. As a result, the optical confinement rate is decreased. This brings about an increment in the threshold current. Accordingly, an influence of the carrier block layer on the guided mode has to be lessened. According to the present invention, a variety of trial manufactures of the semiconductor laser has been repeated. Consequently, it was found that $V_2$ corresponding to the normalized frequency of the wave guide layer is in the range of $\pi/4$–$\pi$.

If $V_2$ increases up to a level of $\pi$, multiple transverse mode is not excited; further increasing $V_2$ over $\pi$ may cause the second-order mode oscillation.

As $V_2$ decreases to far less than $\pi/4$, a guided mode profile in the active layer becomes sharp and, it was also found that the carrier block layer did not disturb a trace of the whole guided mode, where the following relationship is established:

$$V_1<V_2/10.$$

Moreover, we also confirmed through the various trial manufactures of the semiconductor laser that especially the following condition is effective in canceling the guiding function of the active layer by the carrier block layer:

$$V_0/3<V_1<V_0.$$

Furthermore, the carrier block layer has to effectively confine the carrier in the active layer. We have found out that the carrier can be sufficiently effectively confined in the active layer when $E>2.5\cdot10^3/d_1^2$, where $d_1$ (angstrom) is the thickness of the carrier block layer, and E (eV) is the energy gap difference between the wave guide layer and the carrier block layer.

Herein, the composition of the wave guide layer is set preferably to $Al_xGa_{1-x}As$ ($0\leqq x<0.35$: where x is the atomic ratio) in the semiconductor laser using $Al_xGa_{1-x}As$.

More specifically, when $\Delta x$ is the aluminum composition difference between the wave guide layer and the carrier block layer, the relationship between $\Delta x$ and the thickness $d_1$ (angstrom) of the carrier block layer preferably falls within the following range:

$$\Delta x>(2.2\cdot10^3/d_1^2),\text{ and }\Delta x<(5.0\cdot10^4/d_1^2).$$

Further, $V_0$ is given by:

$$V_0=\pi\cdot d_0/\lambda\cdot(N_1^2-N_0^2)^{0.5}$$

where $d_0$ is the thickness of the active layer. If the active layer consists of N-pieces of quantum well layers, however, $V_0$ is defined by:

$$V_0=N\cdot\pi d_w/\lambda\cdot(N_1^2-N_0^2)^{0.5}$$

where $d_w$ is the thickness of the quantum well layer, $N_1$ is the refractive index of the quantum well layer, and $N_0$ is the refractive index of the wave guide layer. Then a relationship therebetween is set preferably as follows:

$$(V_0/3)<V_1V_0.$$

The carrier block layers have a large bandgap on both sides of the active layer but a small refractive index and incorporate an anti-guiding function. These carrier block layers act to reduce or cancel the guiding function incorporated into the active layer. Another function thereof is to block the injected carriers and act to confine the electrons and holes in the active layer. This layer also undergoes P- or N-doping, thereby ameliorating the resistance reducing function or the carrier confinement function.

The guided mode control structure of the wave guide layer and the clad layer provides the action to control the expansion of the oscillation mode and the profile stability.

BRIEF DESCRIPTION OF DRAWINGS

FIG. 31 is a graphic chart representing an effective range of a carrier block.

BEST MODE FOR CARRYING OUT THE INVENTION

The present invention will hereinafter be described on the basis of the drawings.

Figures 1A, 1B, 1C, 1D, 1E:
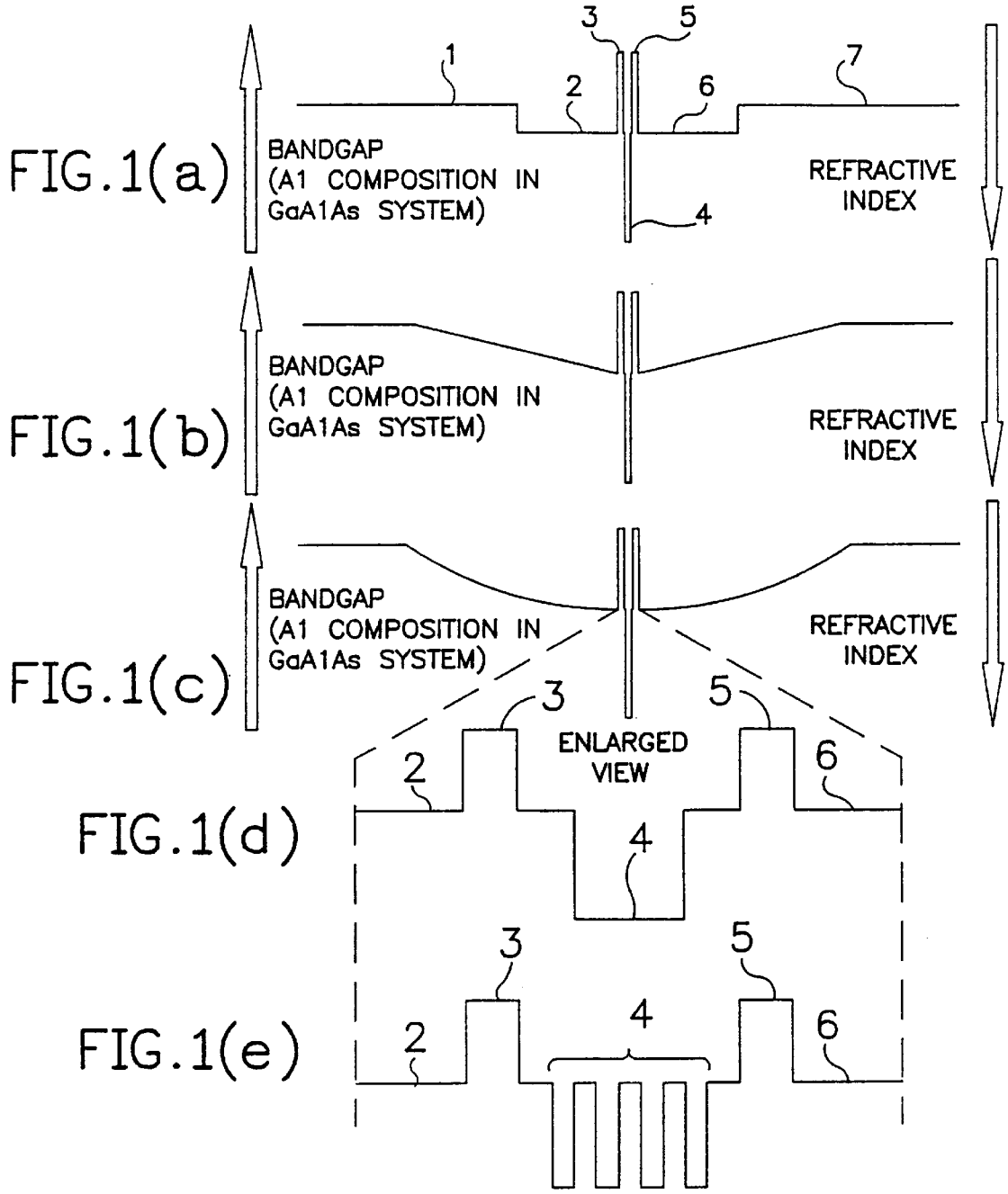
FIG. 1(a) is a schematic sectional view of a semiconductor laser in an epitaxial direction wherein the wave guide layer contains a stepped refractive index distribution.
FIG. 1(b) is a schematic sectional view of a semiconductor laser in an epitaxial direction wherein the wave guide layer contains a straight line refractive index distribution.
FIG. 1(c) is a schematic sectional view of a semiconductor laser in an epitaxial direction wherein the wave guide layer contains a refractive index distribution in the form of a quadratic curve.
FIG. 1(d) is a schematic sectional view of a semiconductor laser in an epitaxial direction showing an enlarged view of the active layer.
FIG. 1(e) is a schematic sectional view of a semiconductor laser in an epitaxial direction showing an enlarged view of a multi-quantum well layer construction of the active layer.
Figure 2:
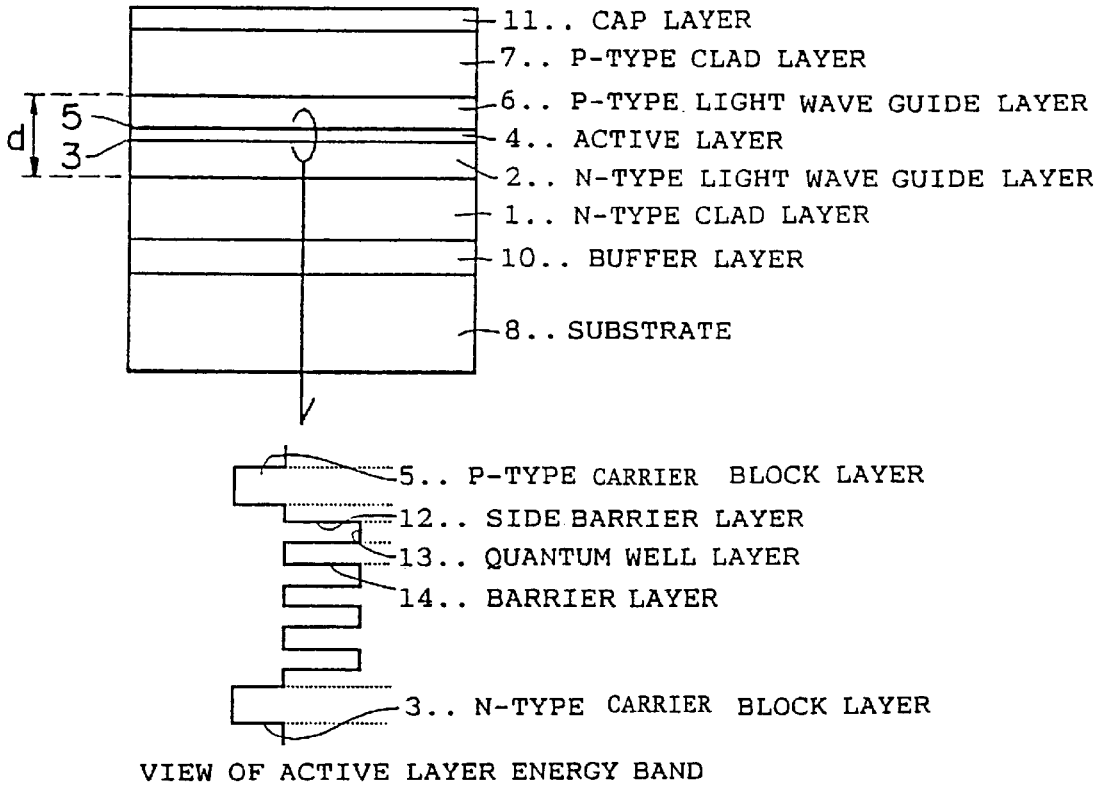
FIG. 2 is a schematic sectional view of a semiconductor laser element according to an embodiment 1 of this invention.
Figure 3:
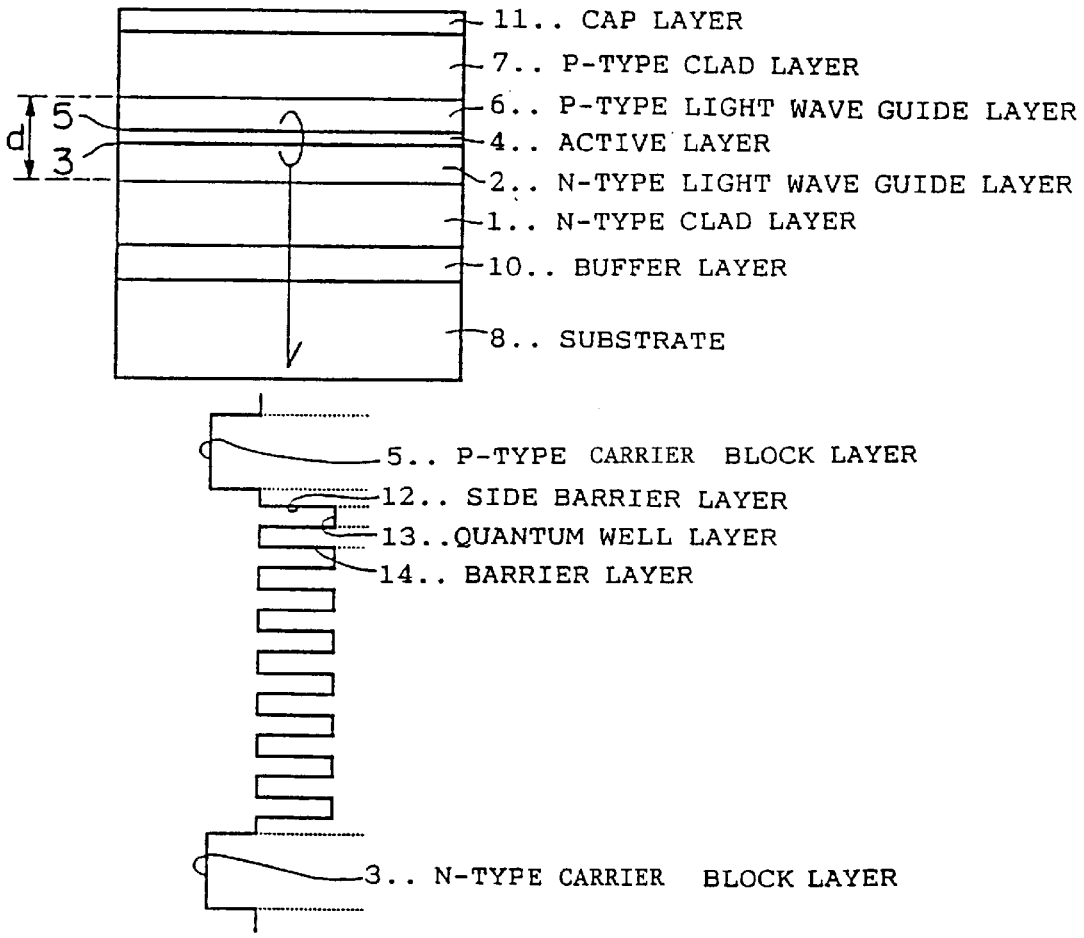
FIG. 3 is a schematic sectional view of a semiconductor laser element according to an embodiment 2 of this invention.
Figure 4:
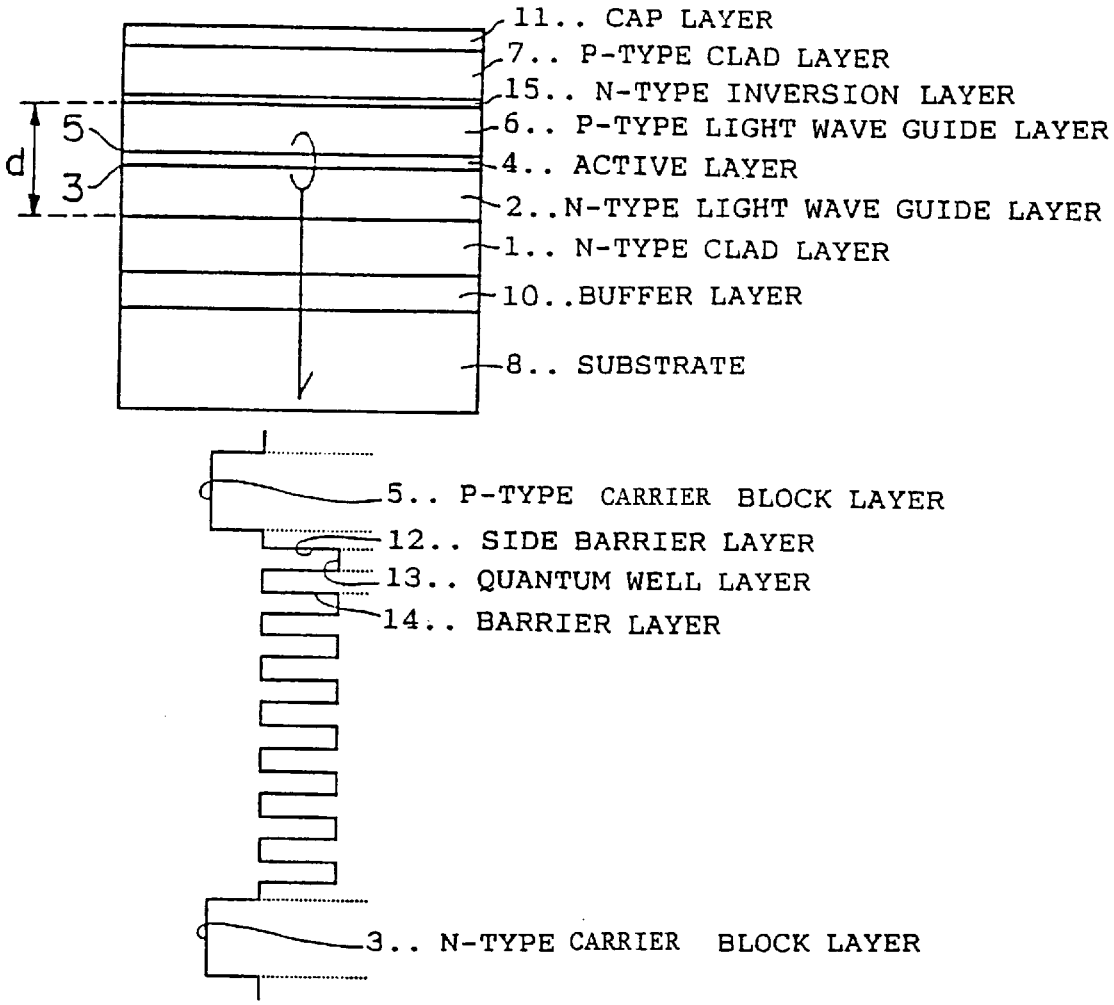
FIG. 4 is a schematic sectional view of a semiconductor laser element according to an embodiment 3 of this invention.
Figure 5:
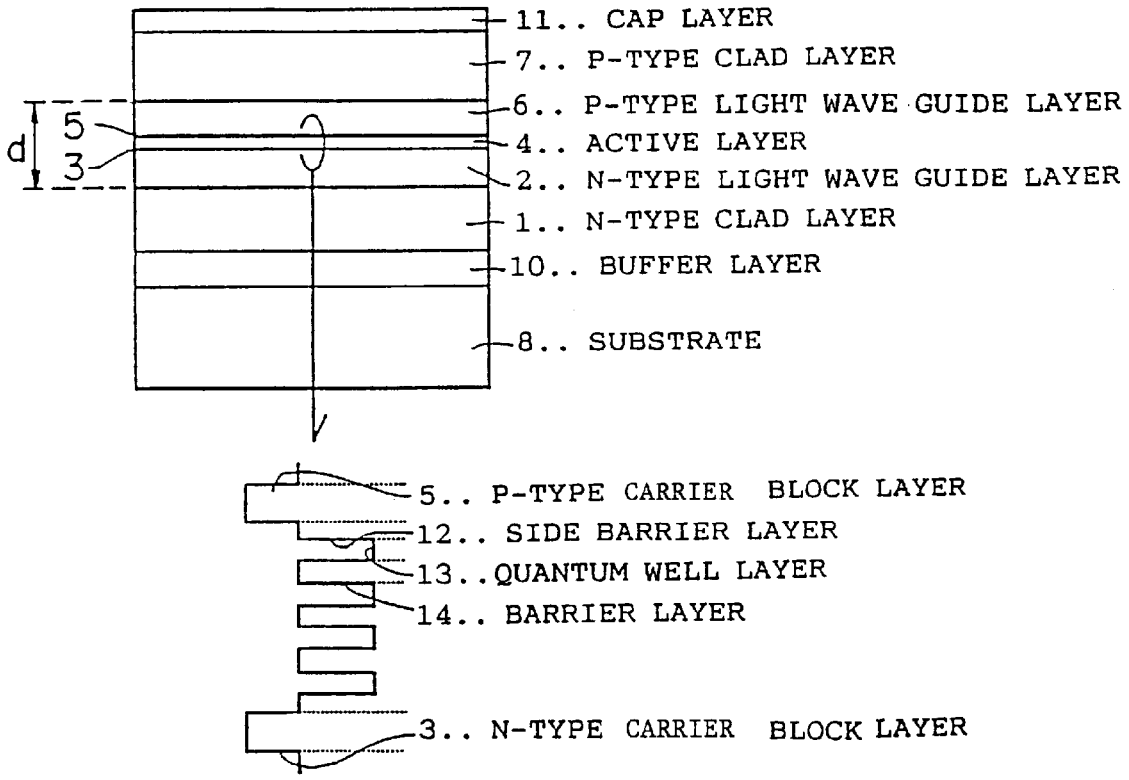
FIG. 5 is a schematic sectional view of a semiconductor laser element according to an embodiment 4 of this invention.
Figure 6:
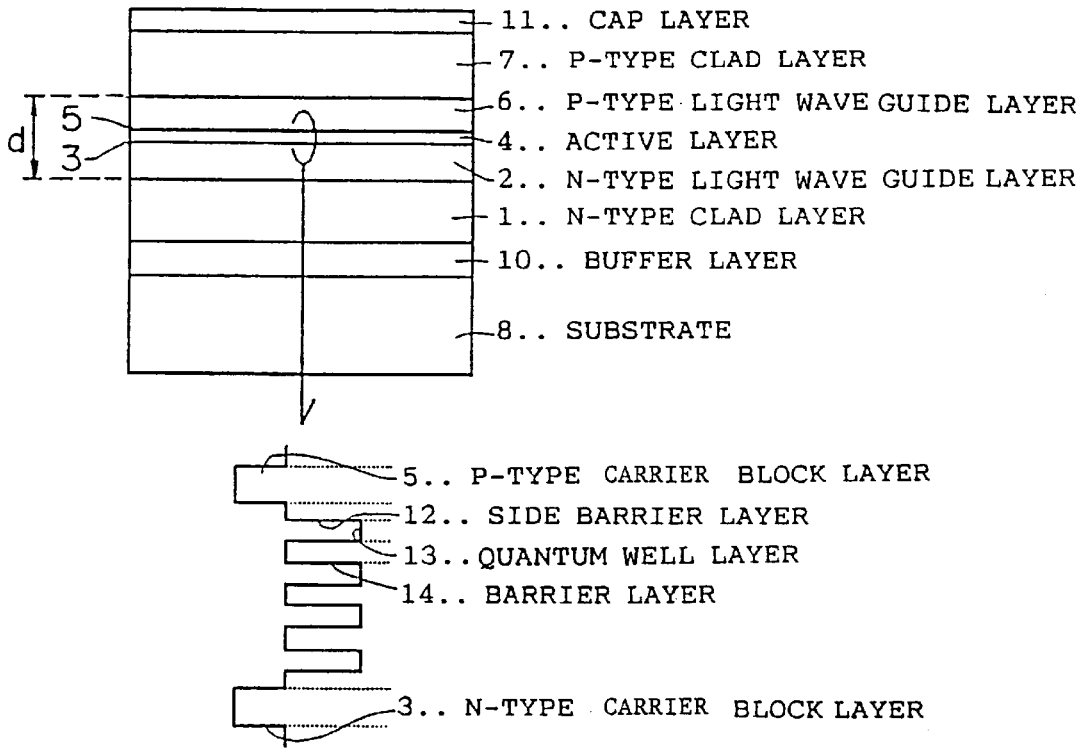
FIG. 6 is a schematic sectional view of a semiconductor laser element according to an embodiment 5 of this invention.
Figure 7:
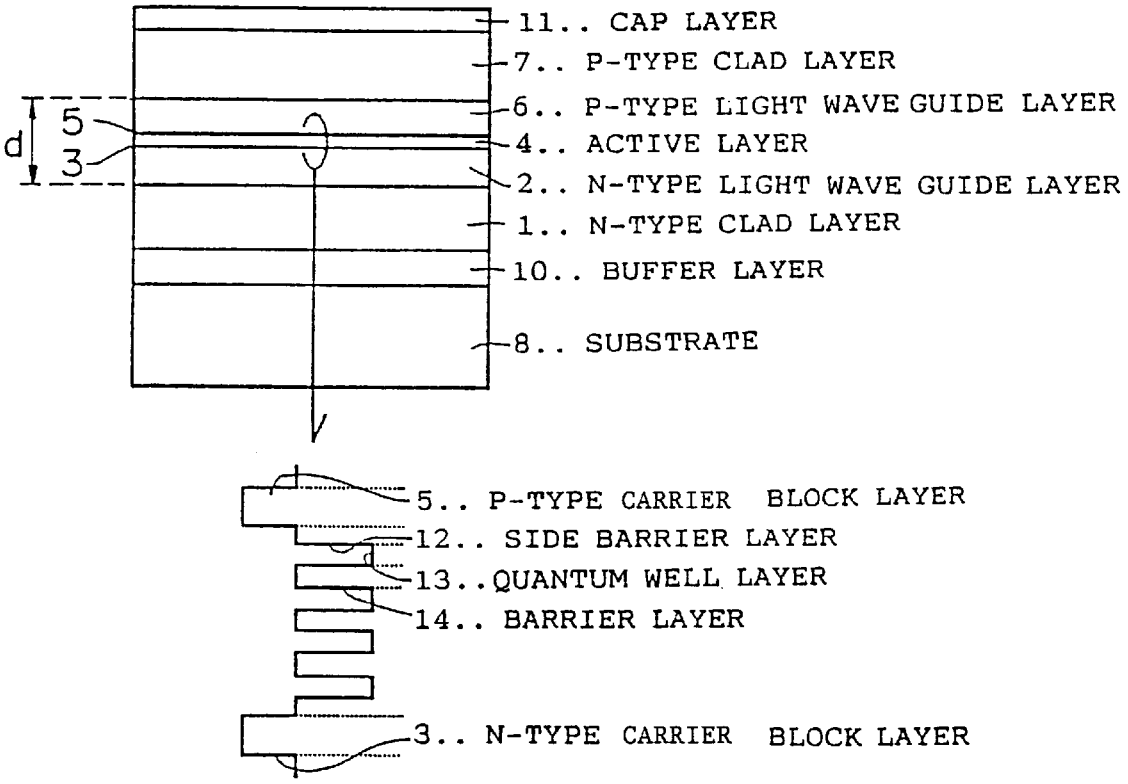
FIG. 7 is a schematic sectional view of a semiconductor laser element according to an embodiment 6 of this invention.
Figure 8:
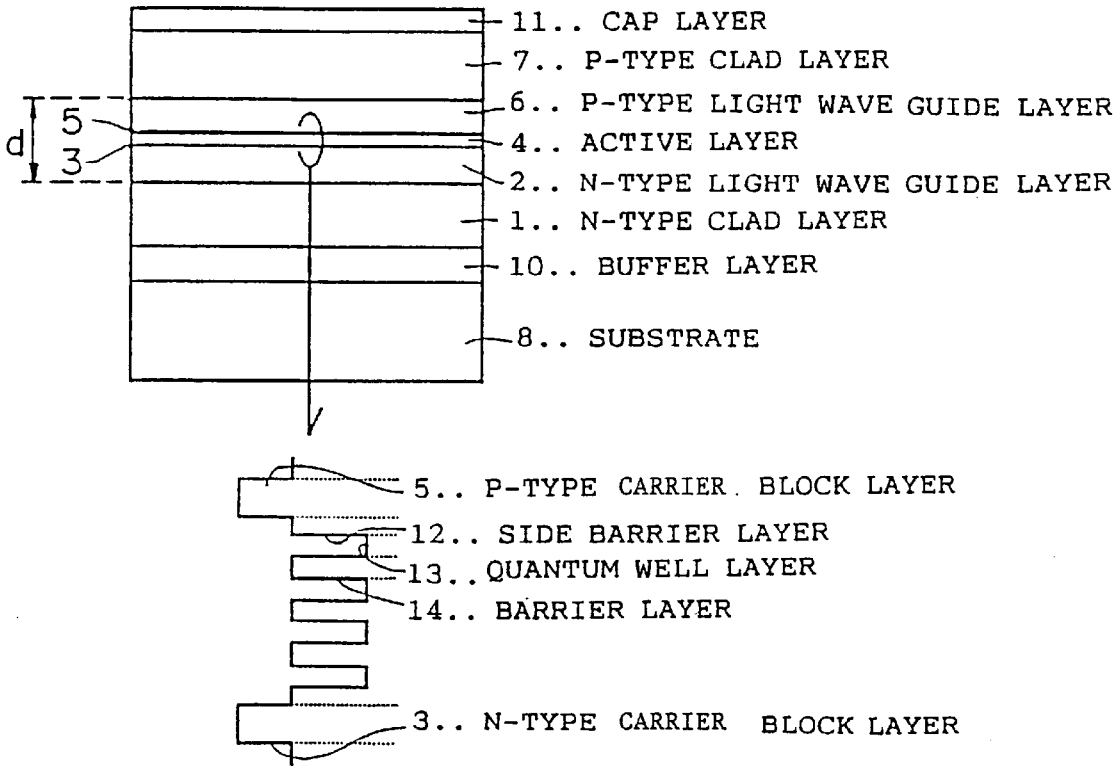
FIG. 8 is a schematic sectional view of a semiconductor laser element according to an embodiment 7 of this invention.
Figure 9:
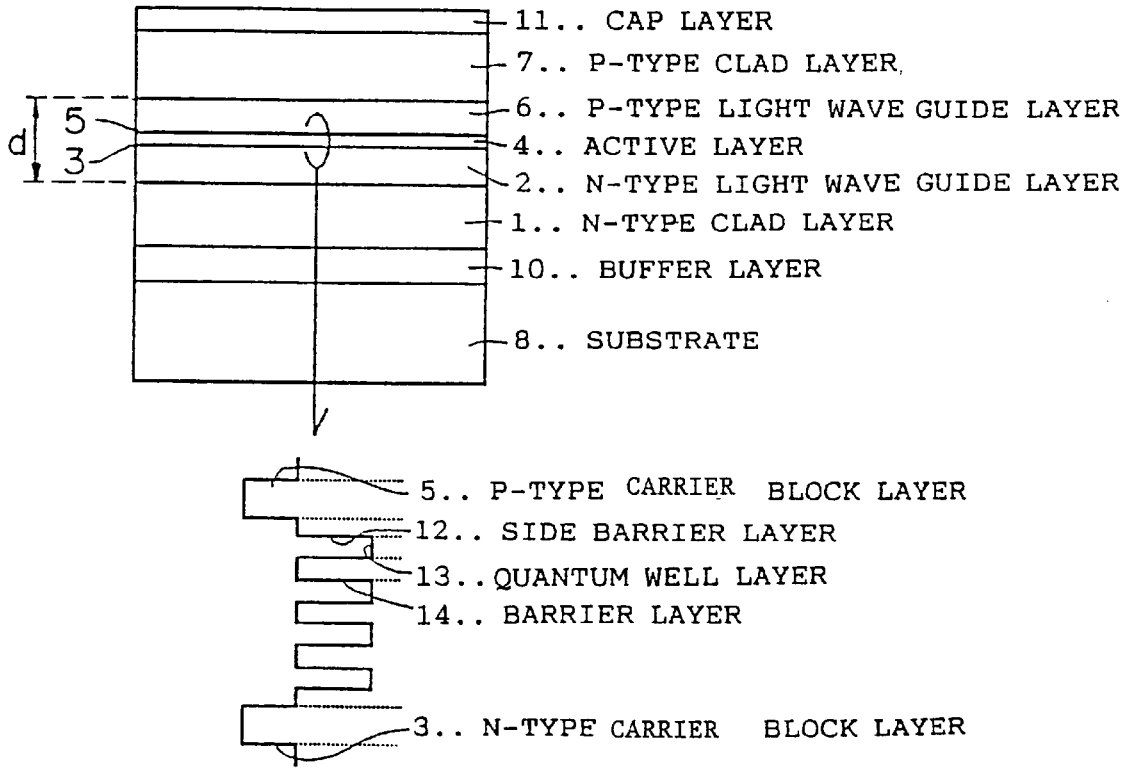
FIG. 9 is a schematic sectional view of a semiconductor laser element according to an embodiment 8 of this invention.
Figure 10:
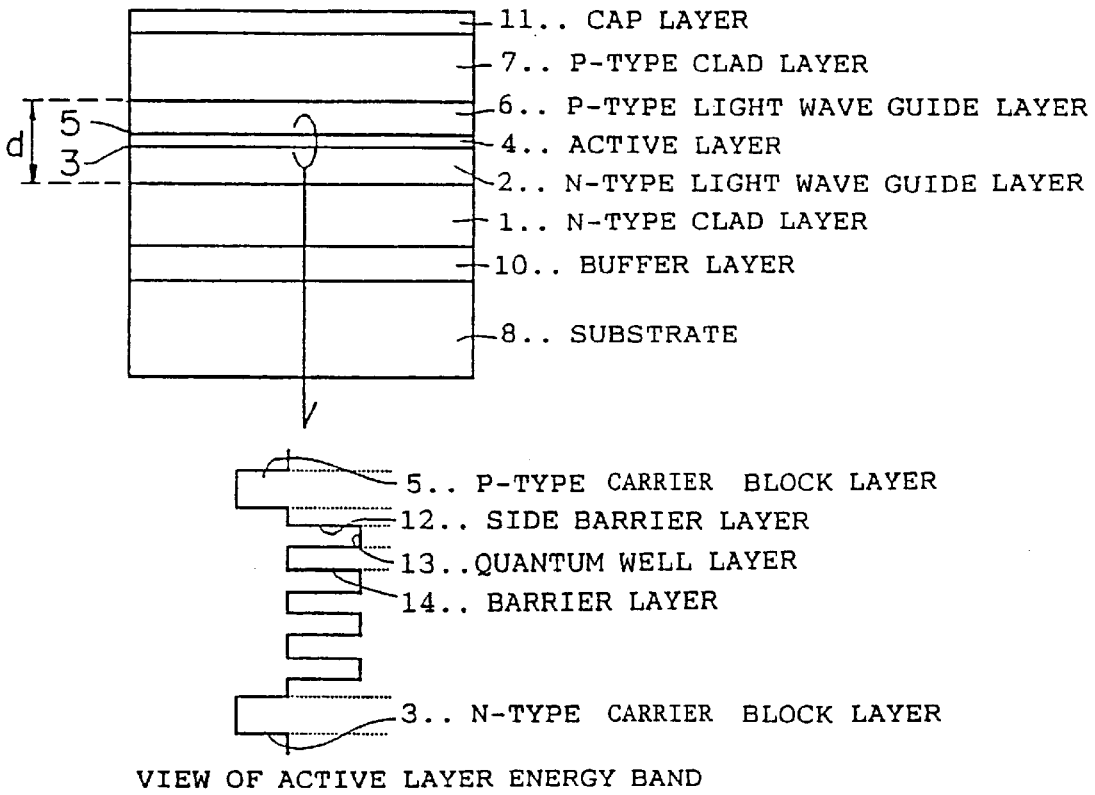
FIG. 10 is a schematic sectional view of a semiconductor laser element according to an embodiment 9 of this invention.
Figure 11:
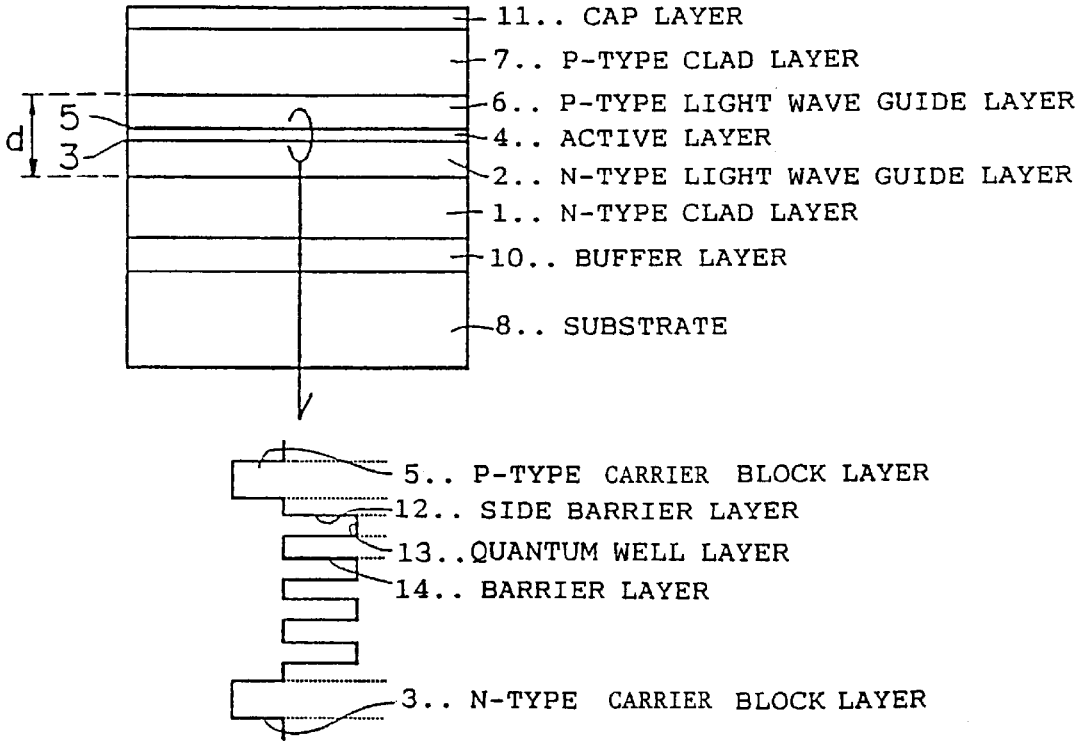
FIG. 11 is a schematic sectional view of a semiconductor laser element according to an embodiment 10 of this invention.
Figure 12:
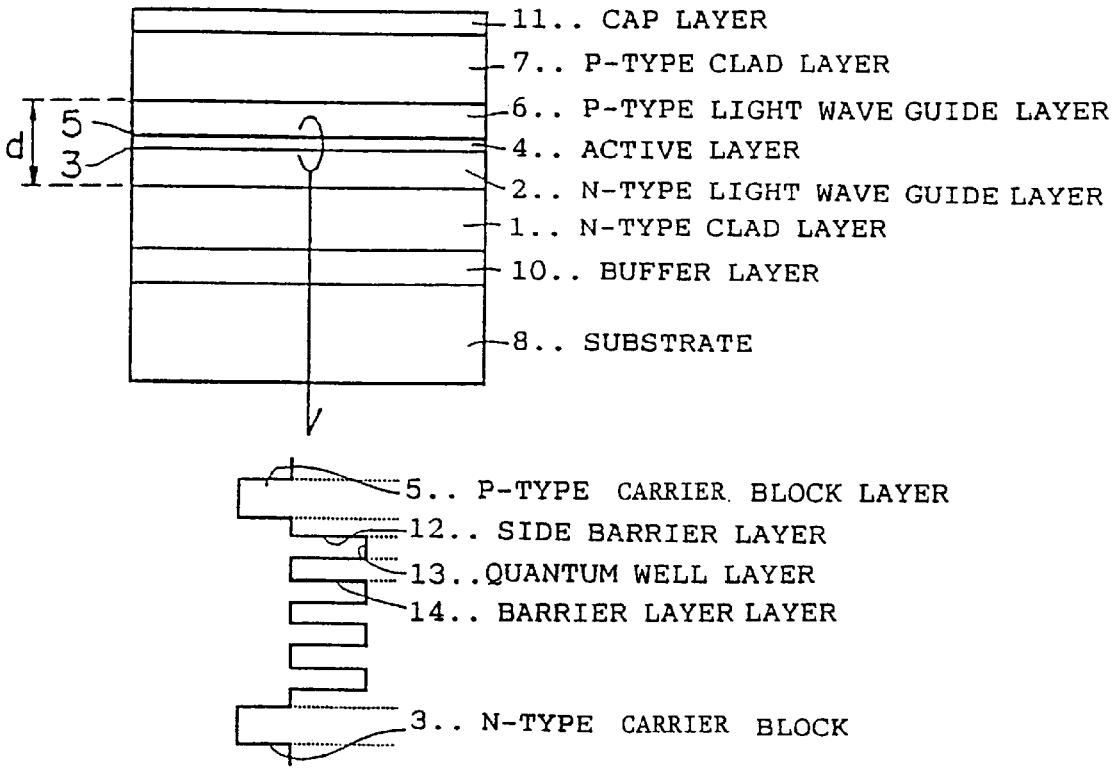
FIG. 12 is a schematic sectional view of a semiconductor laser element according to an embodiment 11 of this invention.
Figure 13:
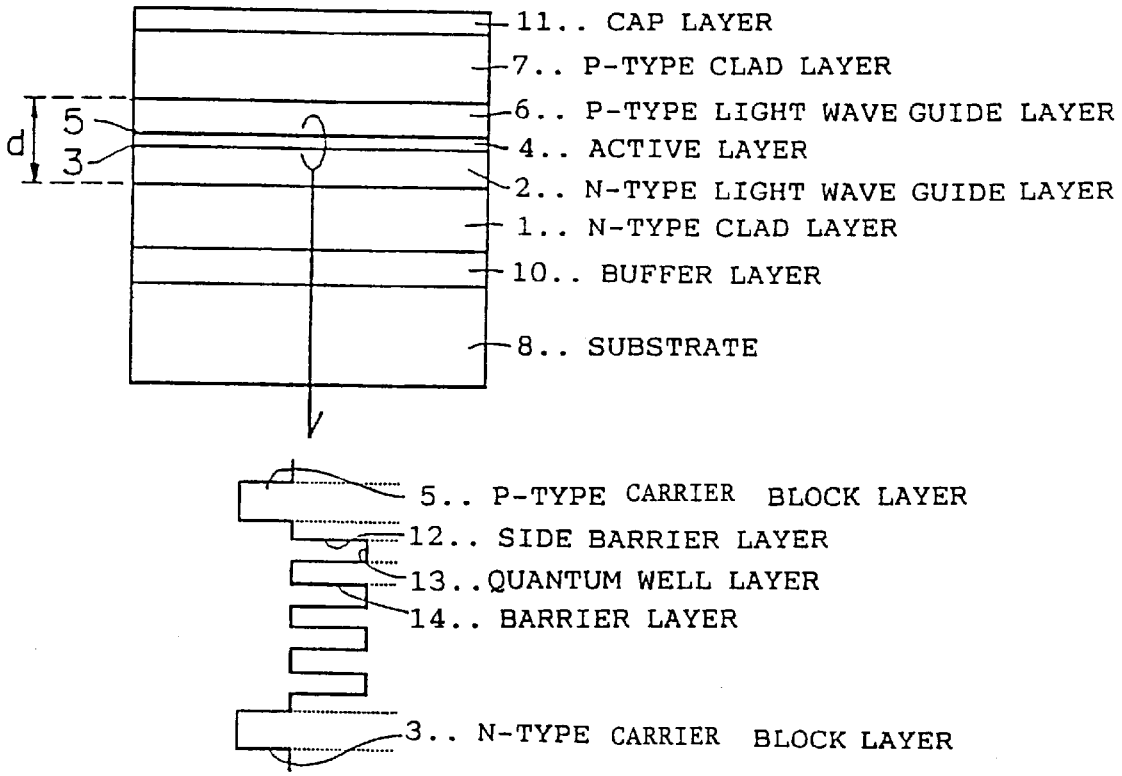
FIG. 13 is a schematic sectional view of a semiconductor laser element according to an embodiment 12 of this invention.
Figure 14:
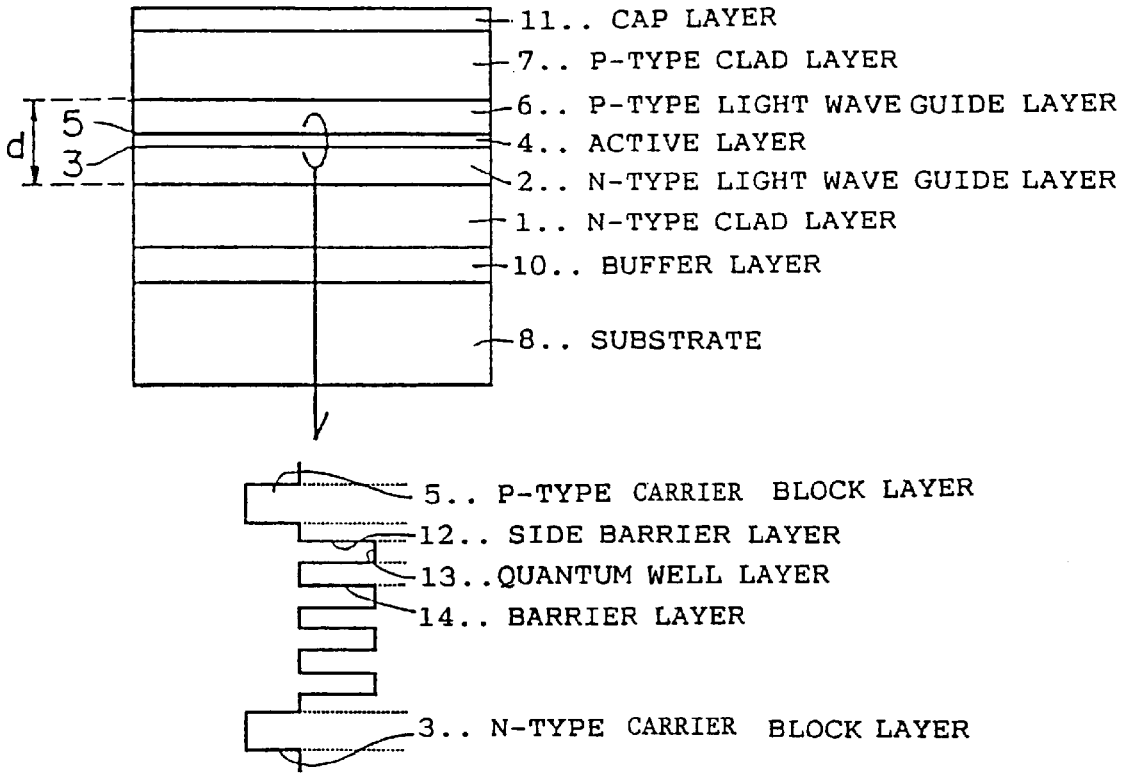
FIG. 14 is a schematic sectional view of a semiconductor laser element according to an embodiment 13 of this invention.
Figure 15:
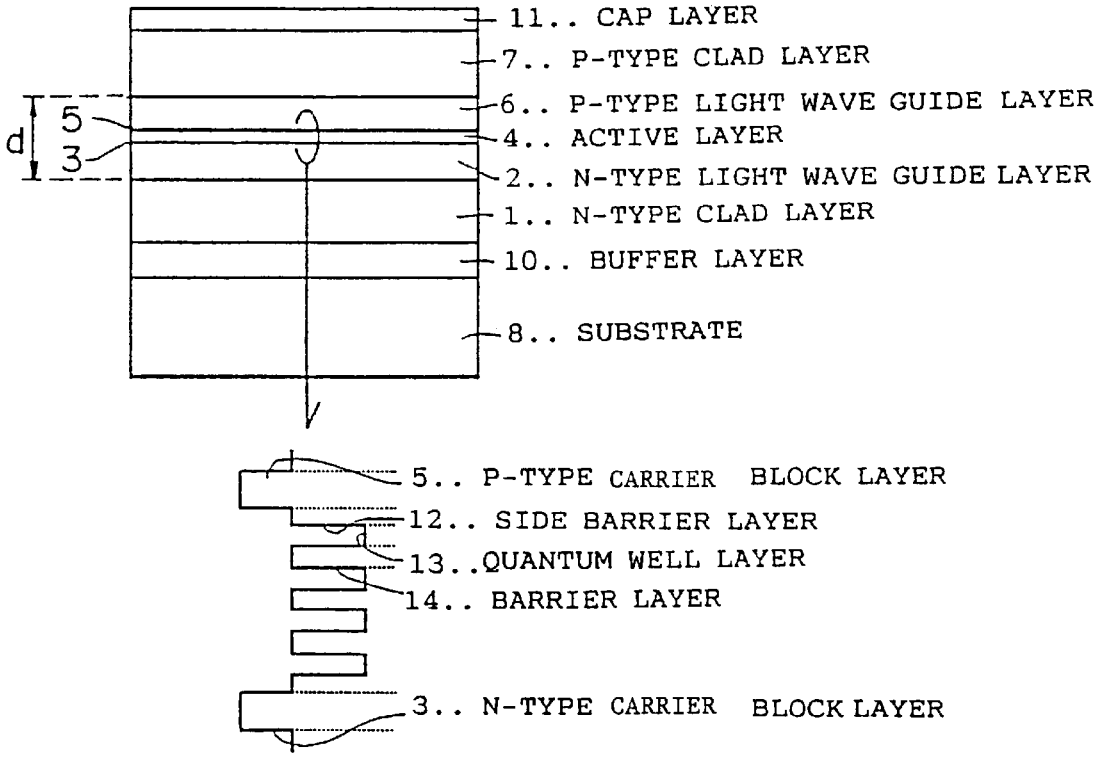
FIG. 15 is a schematic sectional view of a semiconductor laser element according to an embodiment 14 of this invention.
Figure 16:
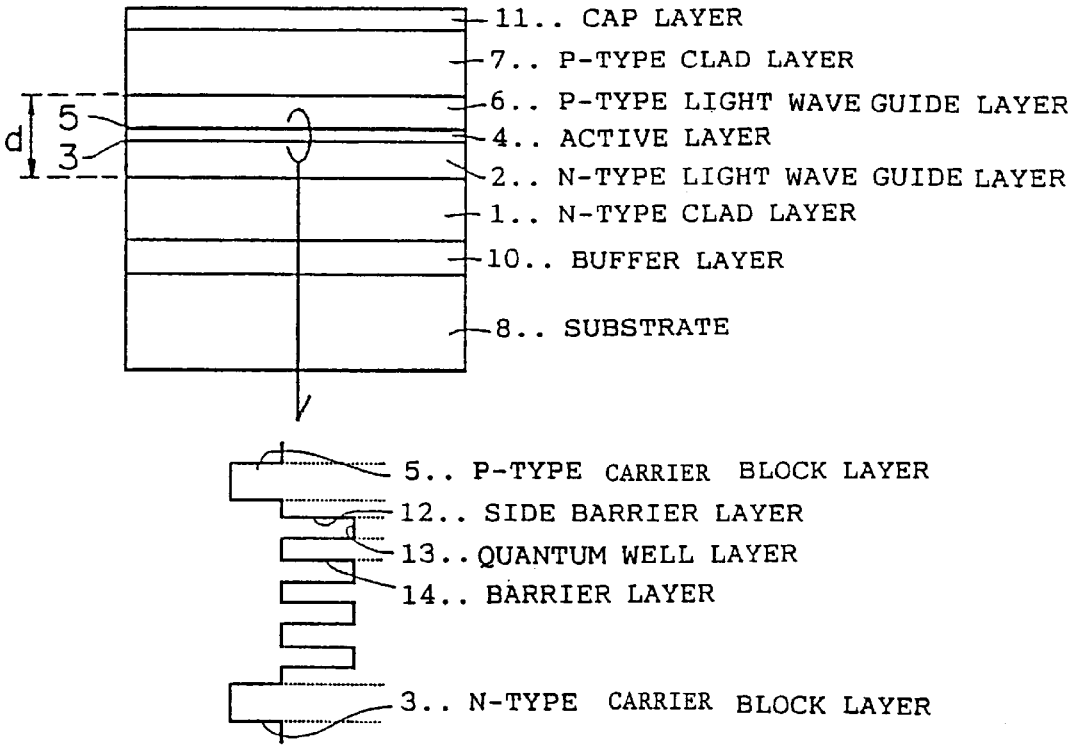
FIG. 16 is a schematic sectional view of a semiconductor laser element according to an embodiment 15 of this invention.
Figure 17:
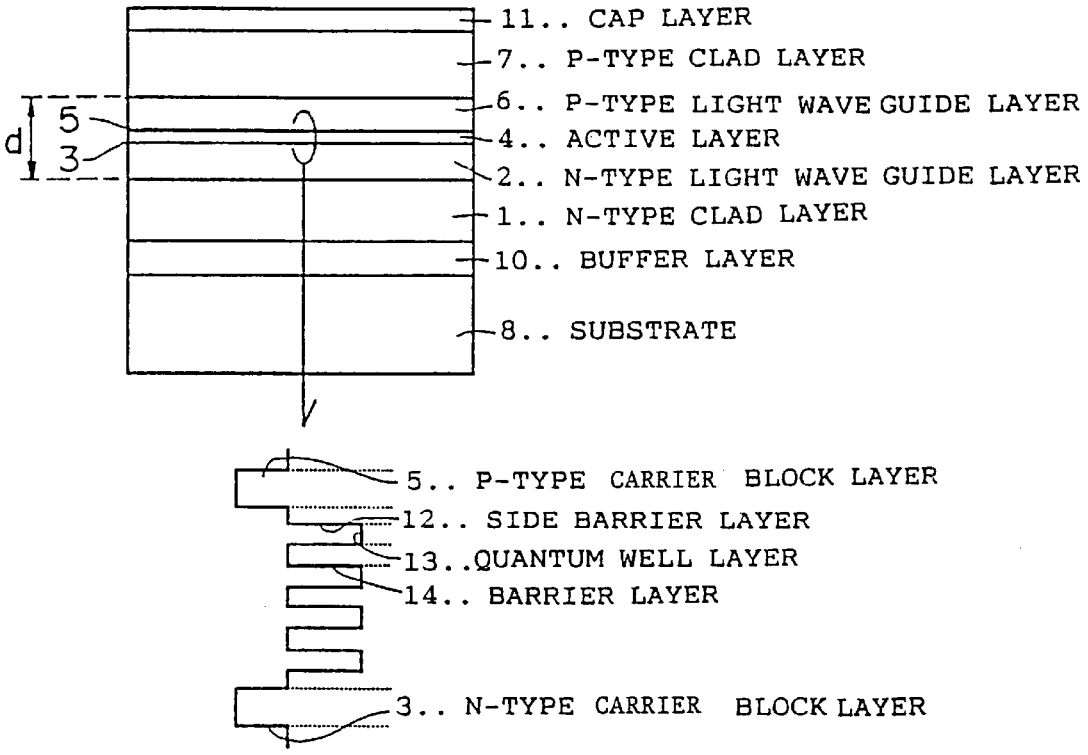
FIG. 17 is a schematic sectional view of a semiconductor laser element according to an embodiment 16 of this invention.
Figure 18:
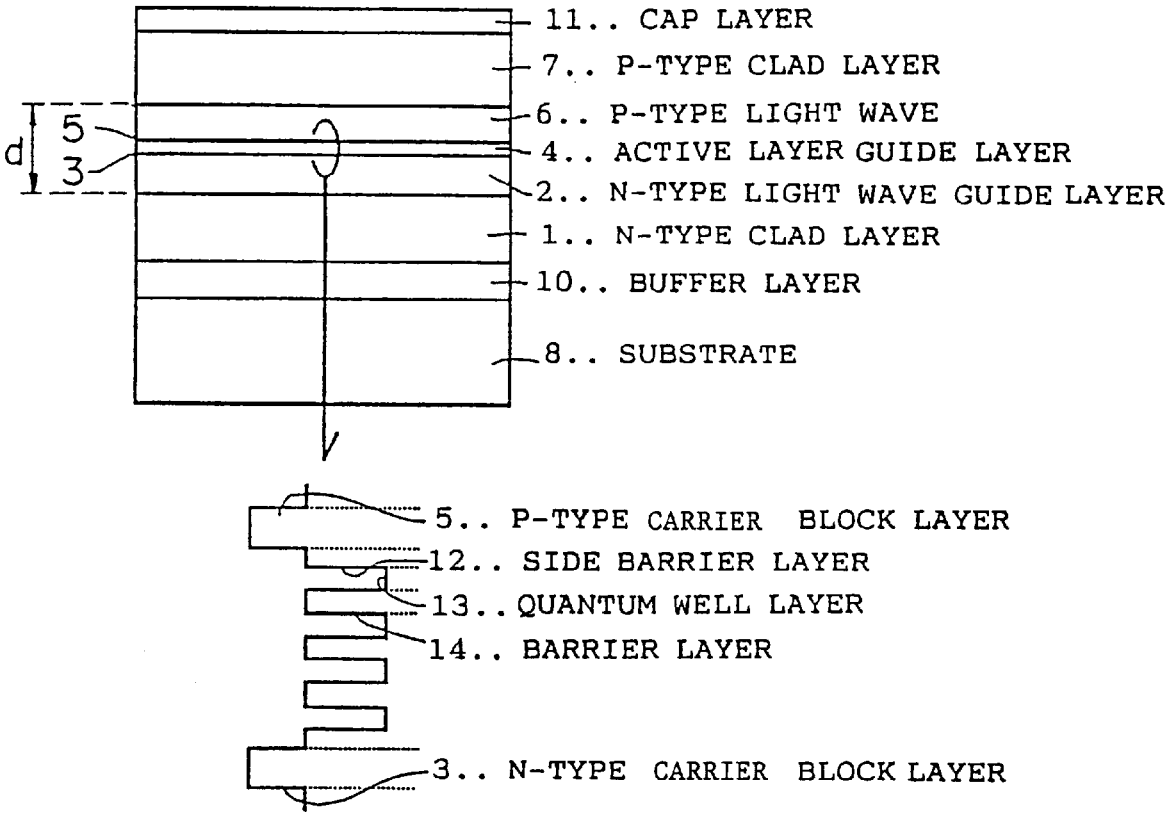
FIG. 18 is a schematic sectional view of a semiconductor laser element according to an embodiment 17 of this invention.
Figure 19:
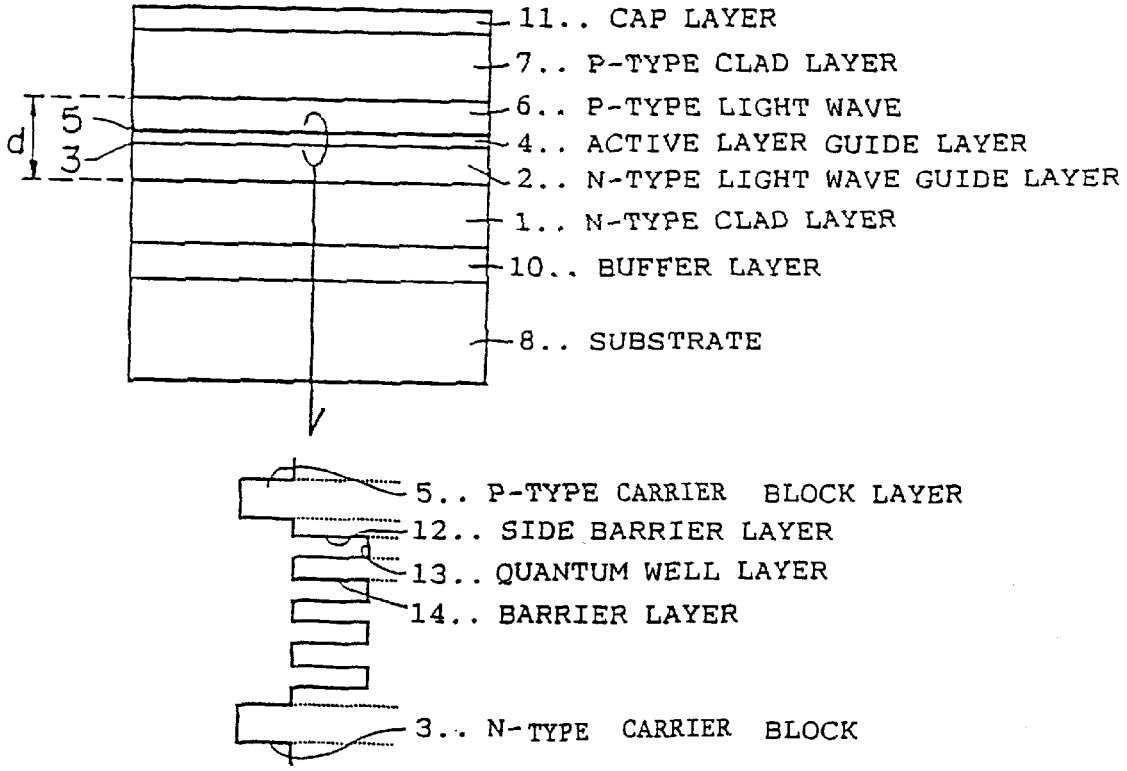
FIG. 19 is a schematic sectional view of a semiconductor laser element according to an embodiment 18 of this invention.
Figure 20:
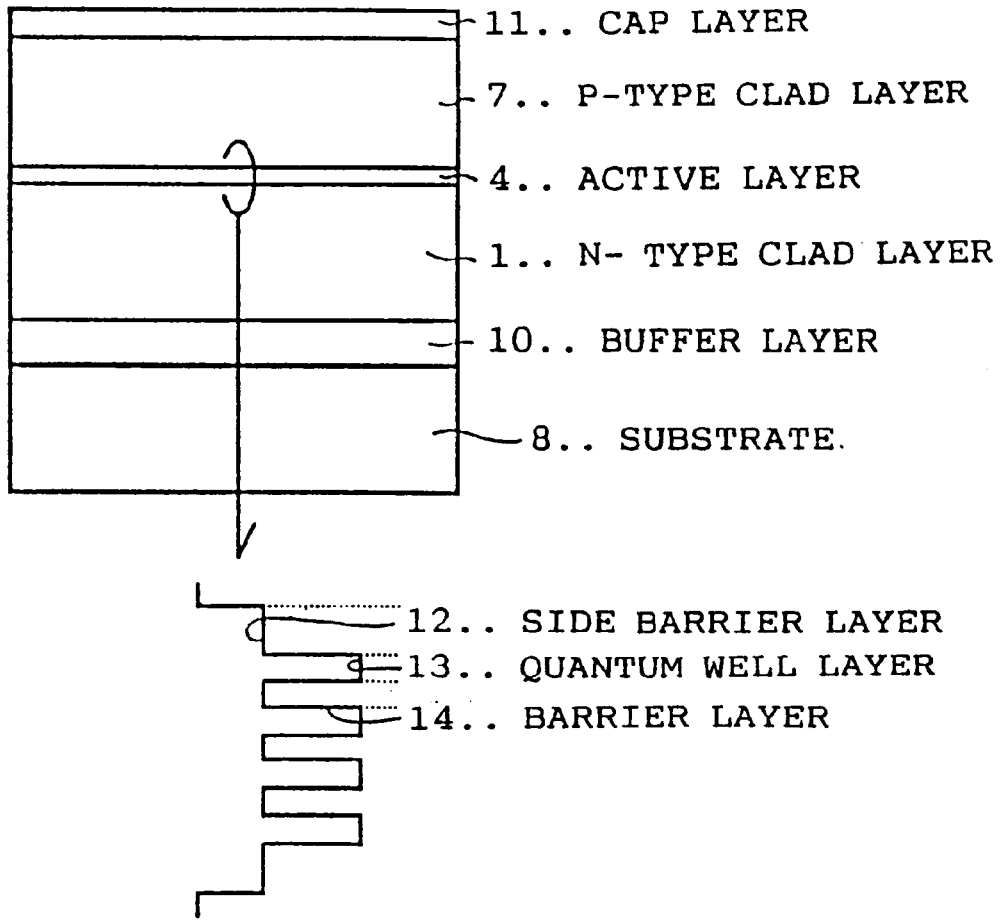
FIG. 20 is a schematic sectional view of a semiconductor laser element according to a comparative example in relation to the present invention.
Figure 21:
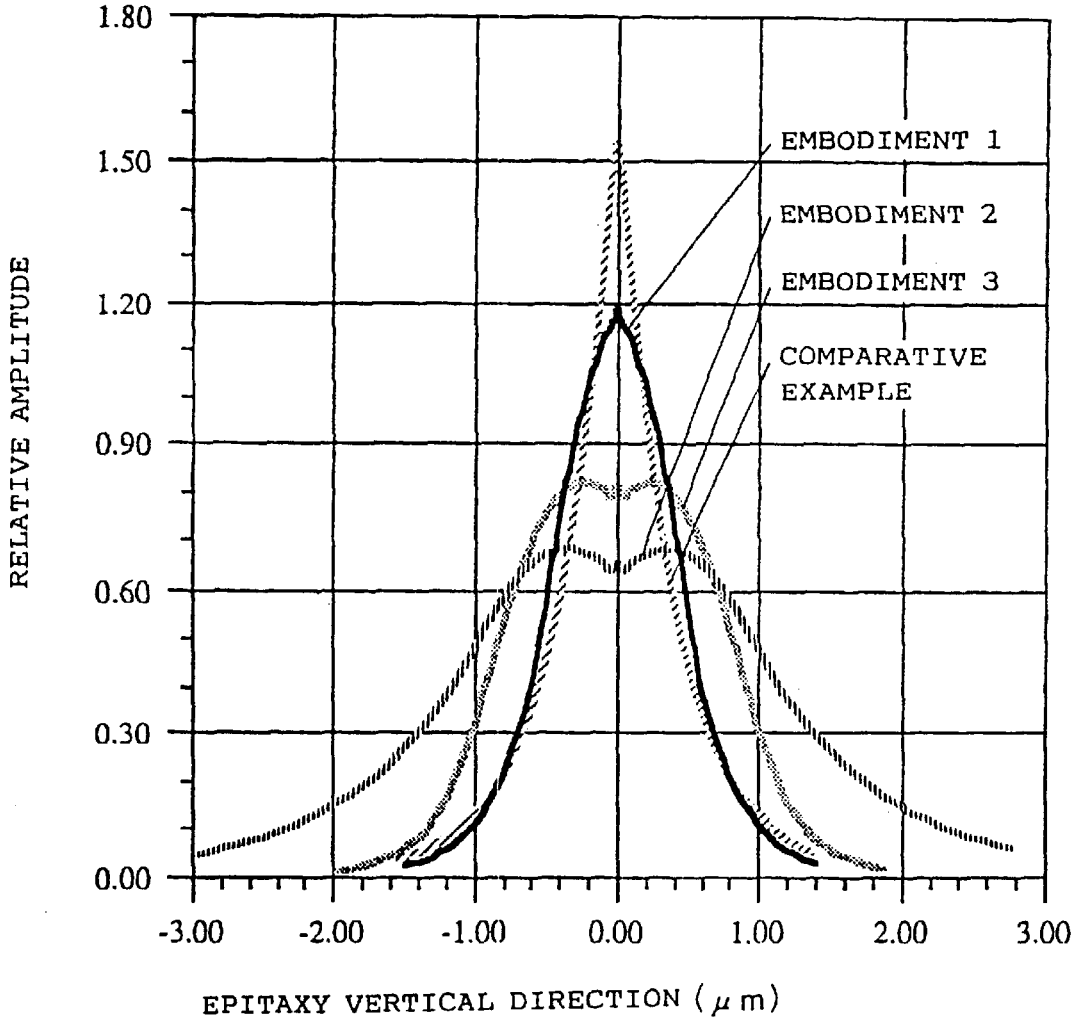
FIG. 21 is a graphic chart showing guided mode characteristics in the embodiments 1–3 and a reference example.
Figure 22:
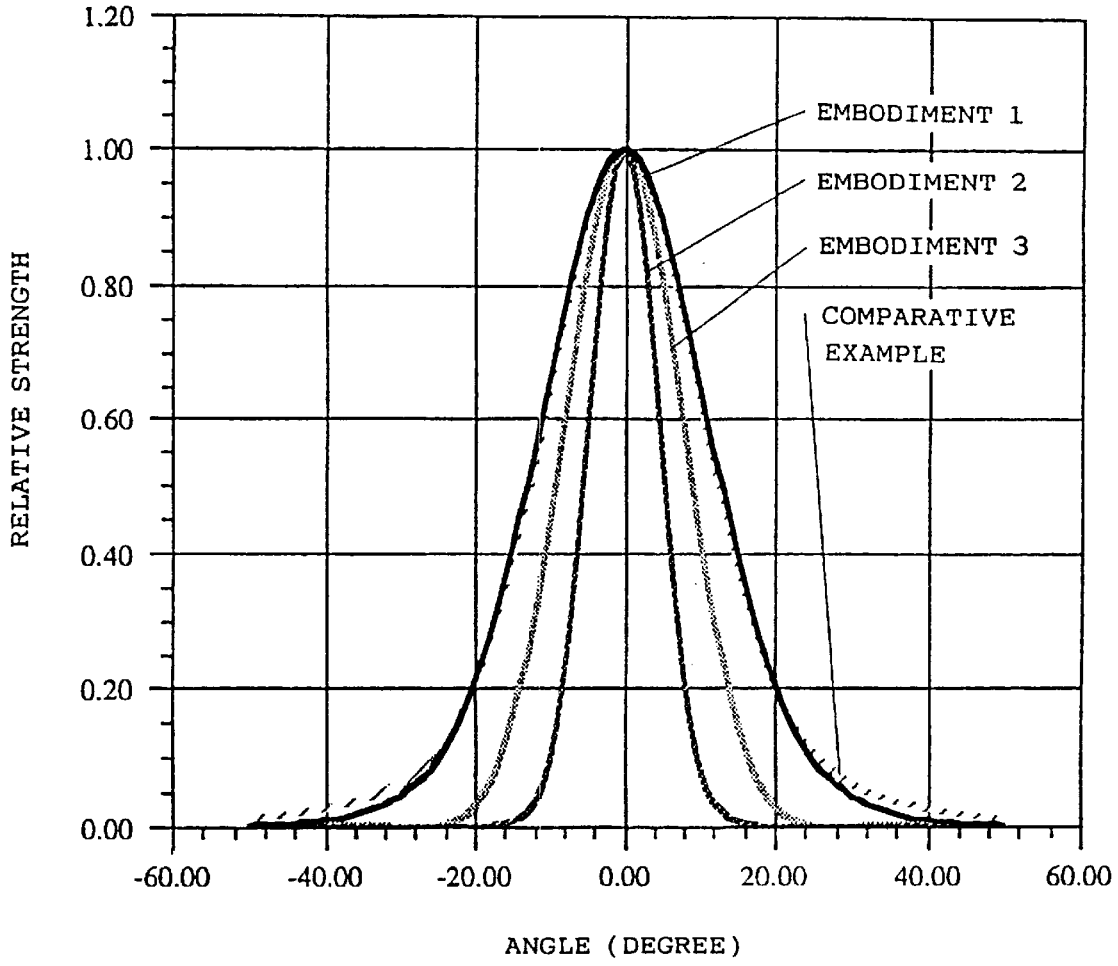
FIG. 22 is a graphic chart showing characteristics of a radiation beam angle in the embodiments 1–3 and the reference example.
Figure 23:
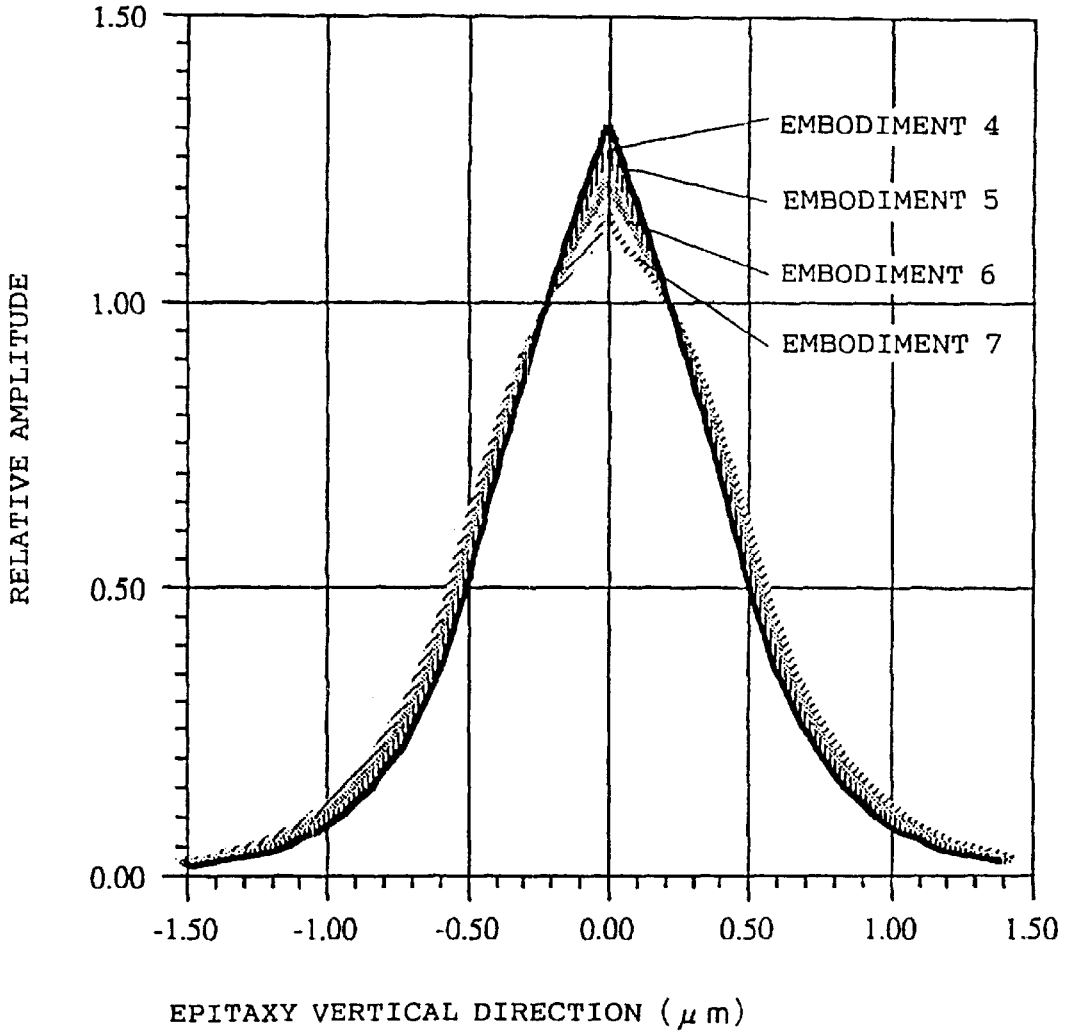
FIG. 23 is a graphic chart showing the guided mode characteristics in embodiments 4–7.
Figure 24:
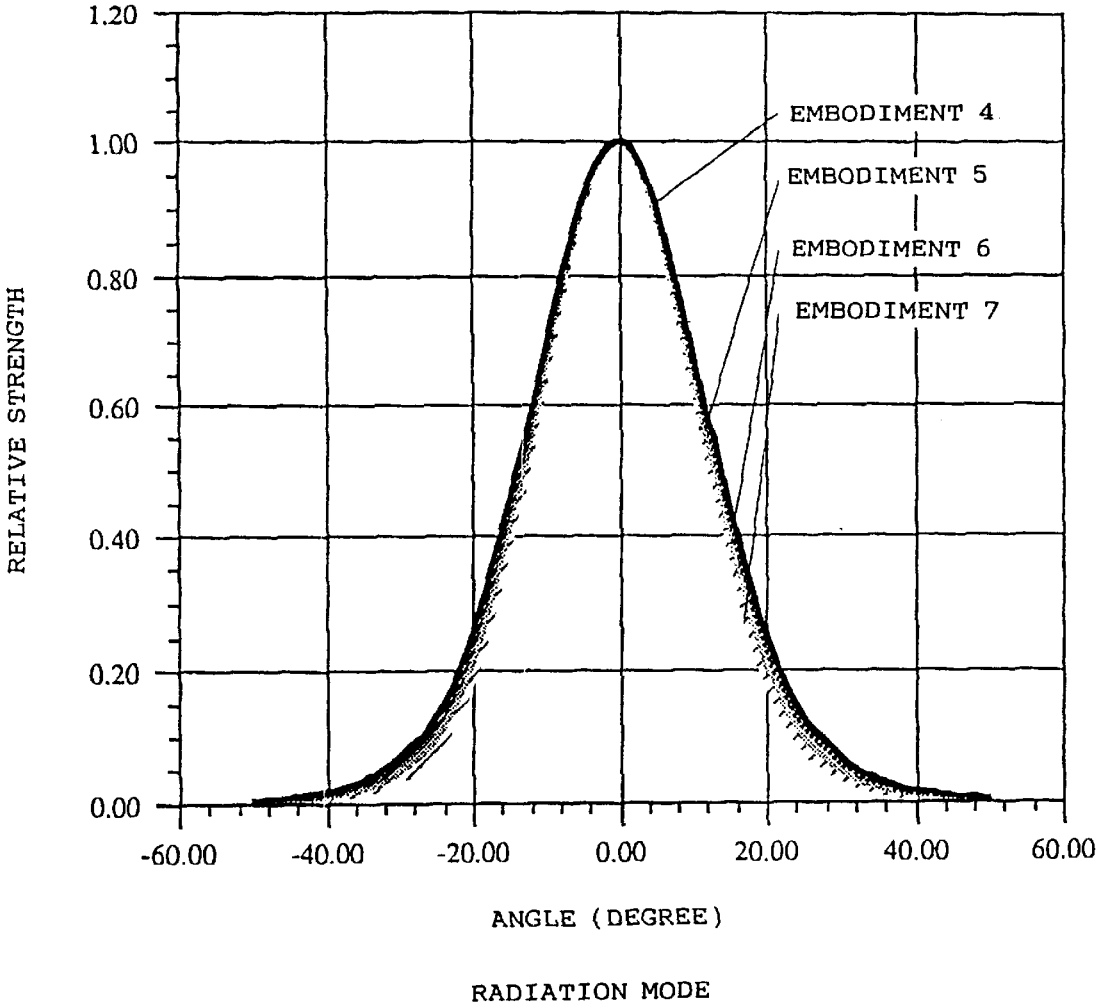
FIG. 24 is a graphic chart showing the characteristics of the radiation beam angle in the embodiments 4–7.
Figure 25:
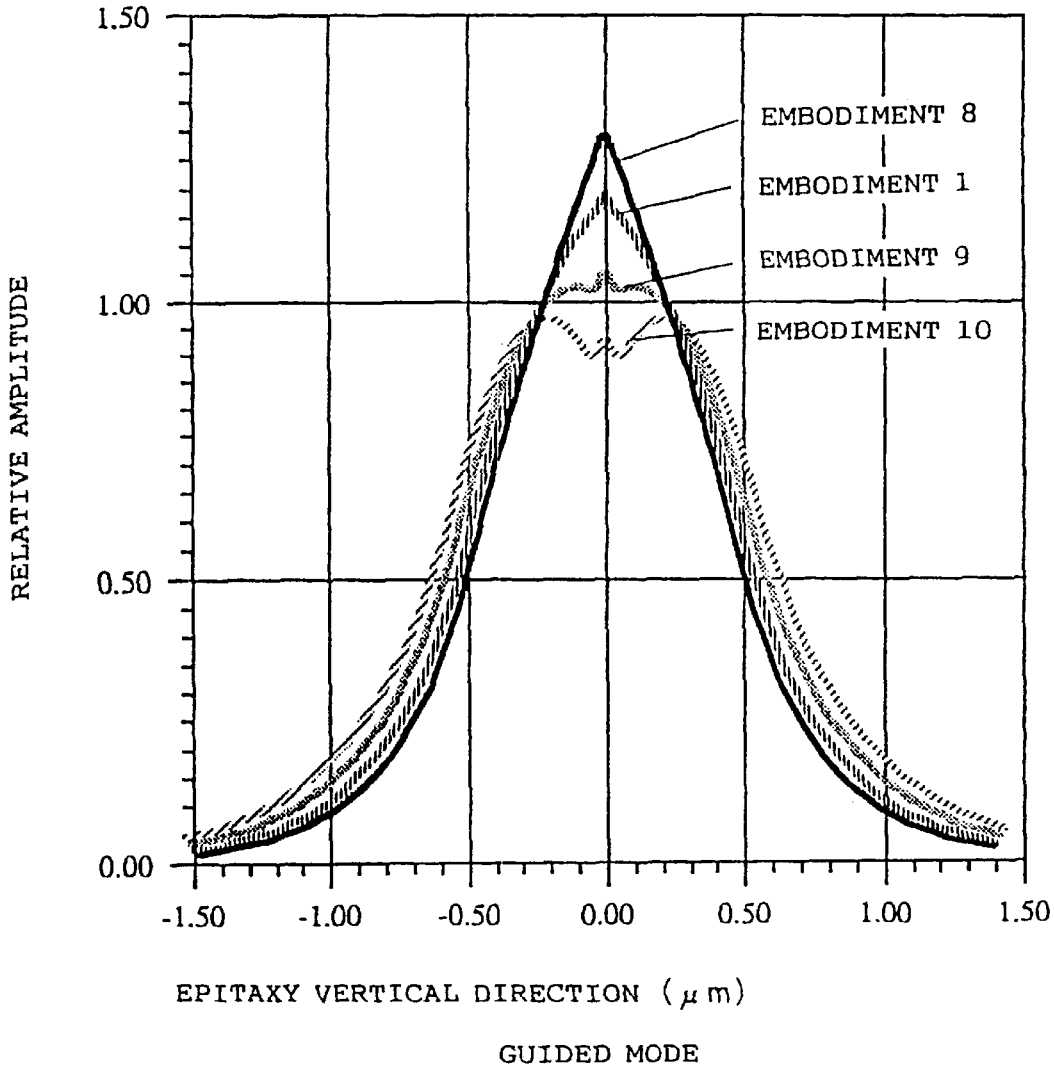
FIG. 25 is a graphic chart showing the guided mode characteristics in embodiments 1 and 8–10.
Figure 26:
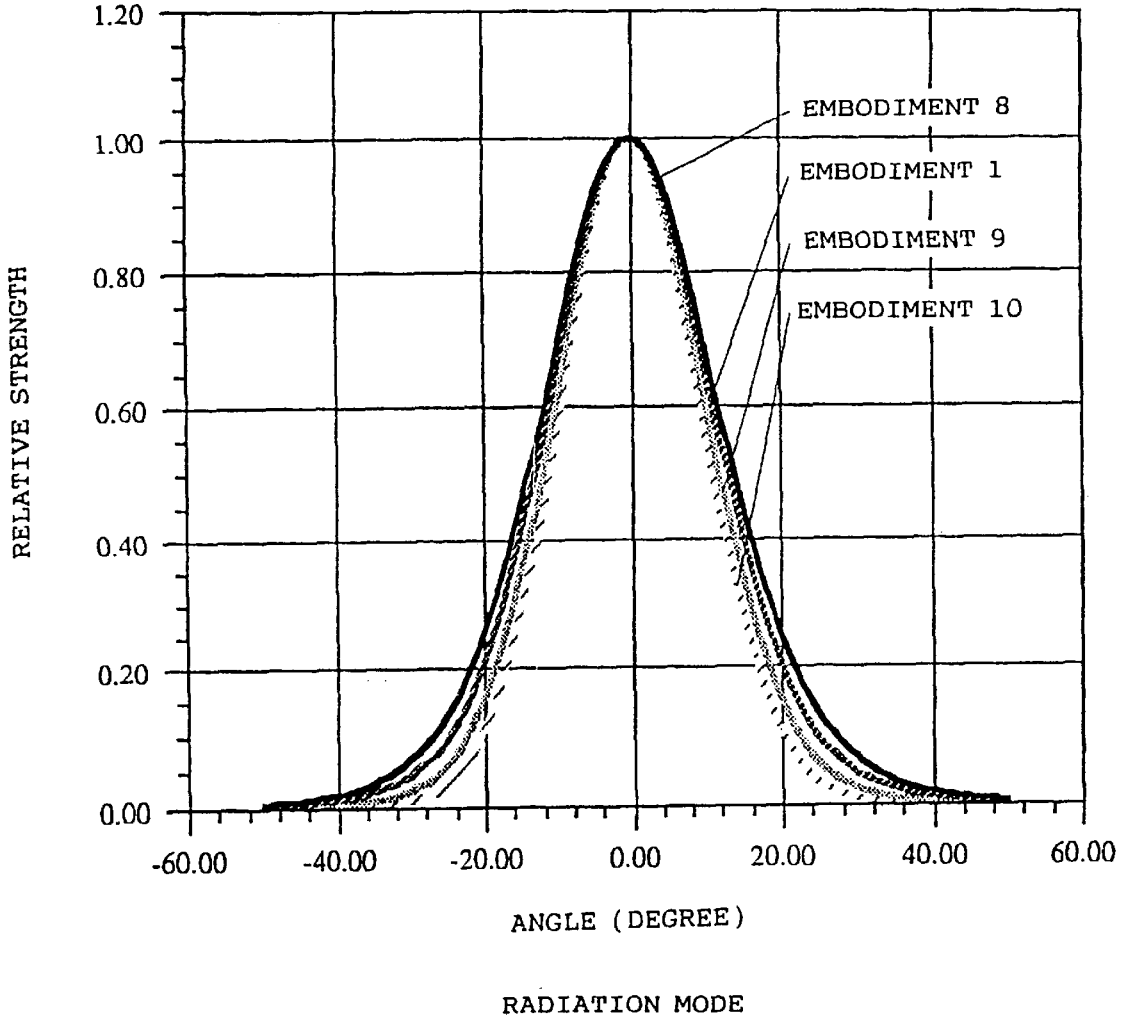
FIG. 26 is a graphic chart showing the characteristics of the radiation beam angle in the embodiments 1 and 8–10.
Figure 27:
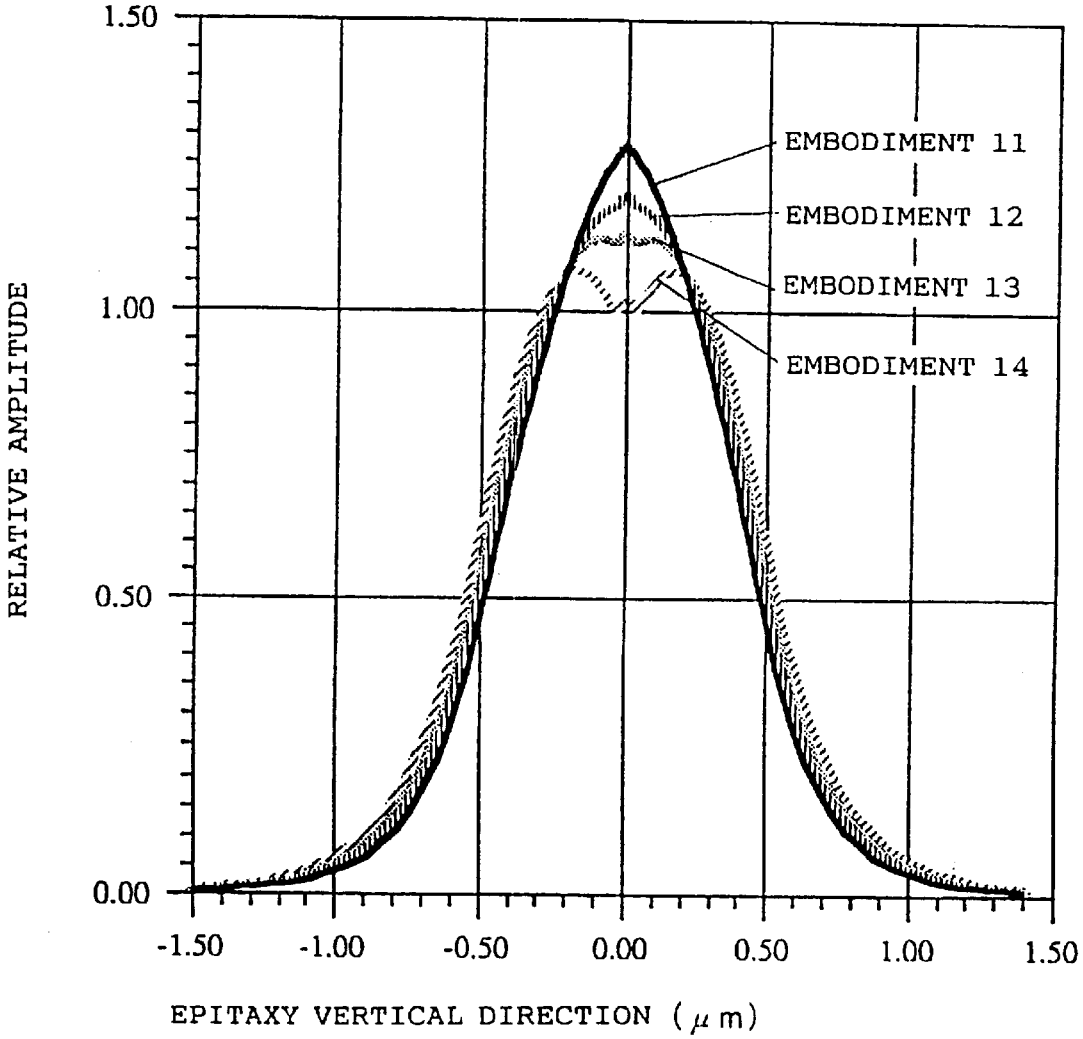
FIG. 27 is a graphic chart showing the guided mode characteristics in embodiments in 11–14.
Figure 28:
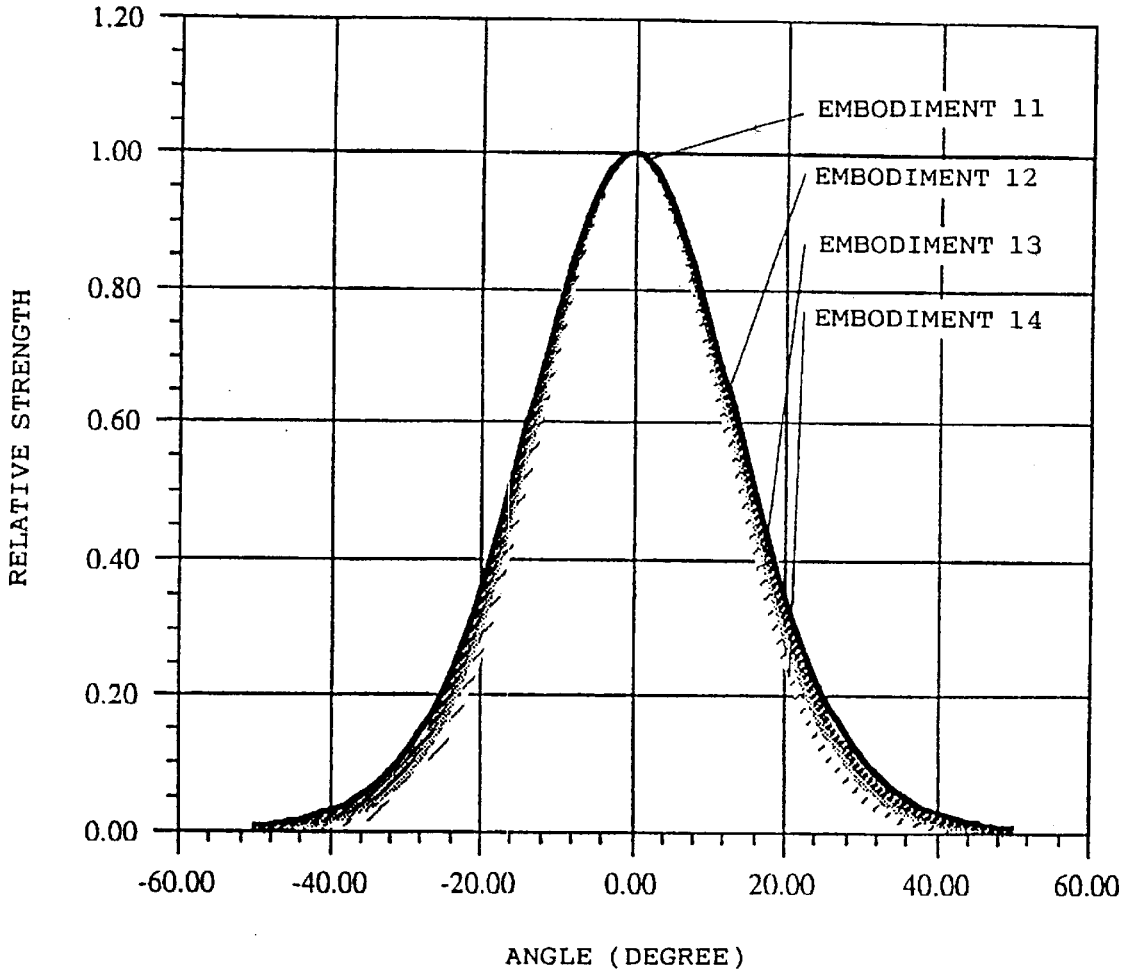
FIG. 28 is a graphic chart showing the characteristics of the radiation beam angle in embodiments 11–14.
Figure 29:
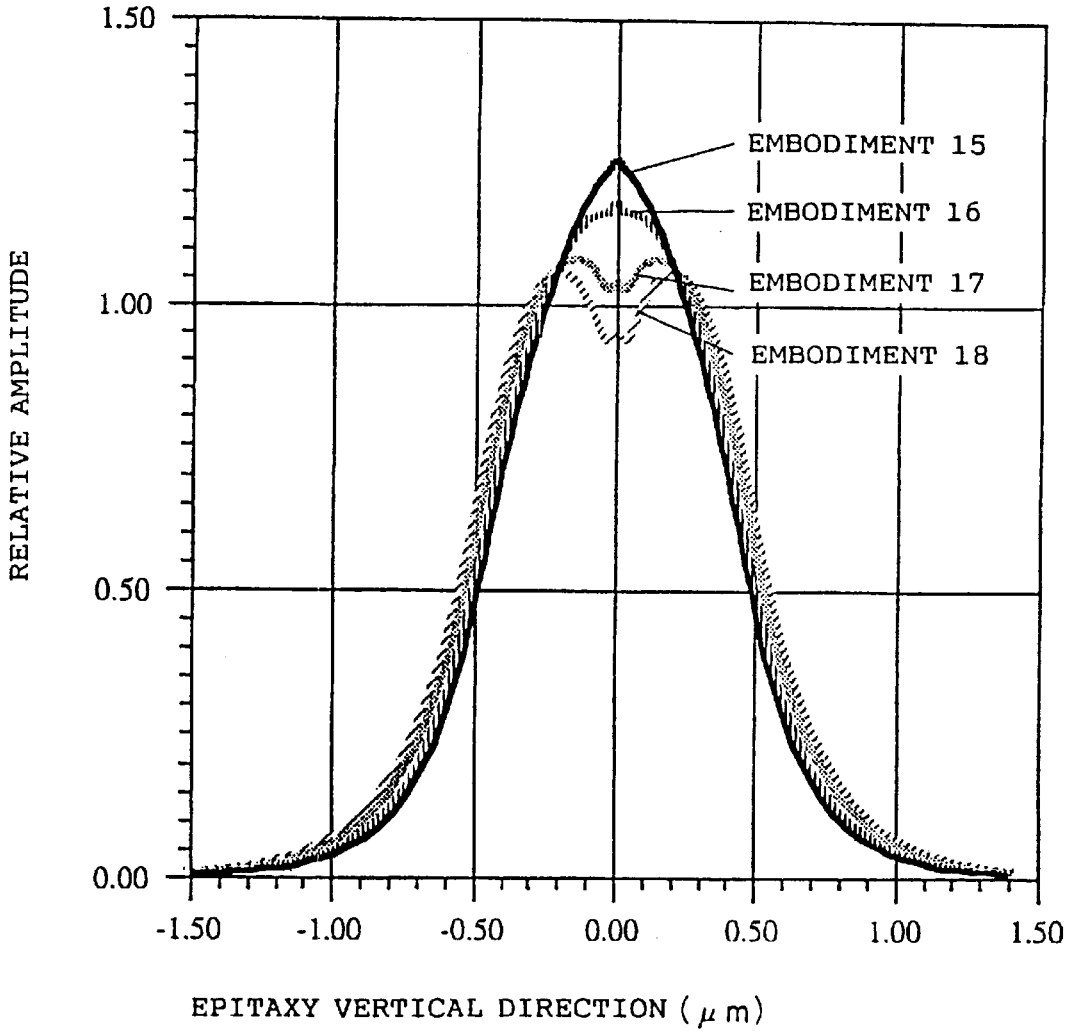
FIG. 29 is a graphic chart showing the guided mode characteristics in embodiments 15–18.
Figure 30:
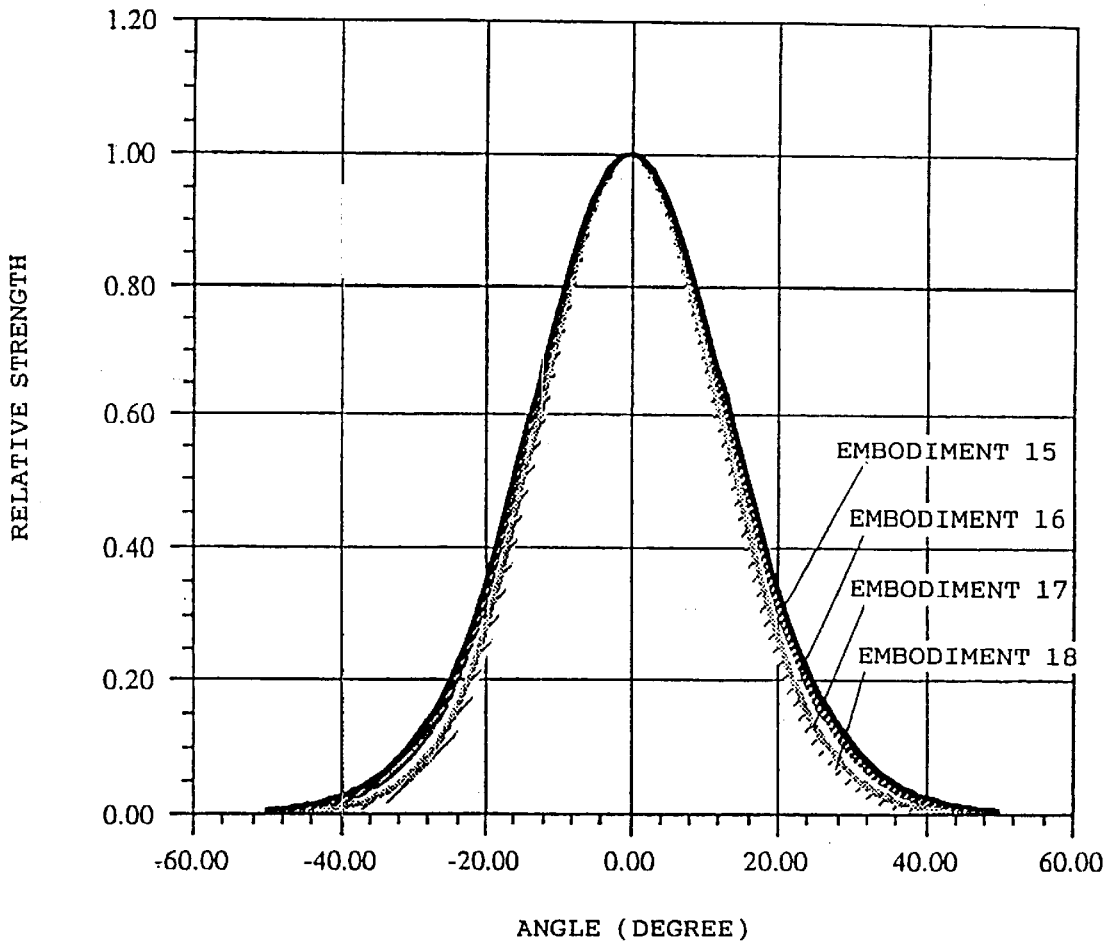
FIG. 30 is a graphic chart showing the characteristics of the radiation beam angle in the embodiments 15–18.

Epitaxial growths exhibiting profiles illustrated in FIGS. 2–20 are performed by MOCVD growth. FIG. 2 shows an embodiment 1. FIG. 3 shows an embodiment 2. FIG. 4 shows an embodiment 3. FIG. 5 shows an embodiment 4. FIG. 6 shows an embodiment 5. FIG. 7 shows an embodiment 6. FIG. 8 shows an embodiment 7. FIG. 9 shows an embodiment 8. FIG. 10 shows an embodiment 9. FIG. 11 shows an embodiment 10. FIG. 12 shows an embodiment 11. FIG. 13 shows an embodiment 12. FIG. 14 shows an embodiment 13. FIG. 15 shows an embodiment 14. FIG. 16 shows an embodiment 15. FIG. 17 shows an embodiment 16. FIG. 18 shows an embodiment 17. FIG. 19 shows an embodiment 18. FIG. 20 is a schematic plan view thereof in a comparative example. FIG. 21 is a graphic chart showing a guided mode in the embodiments 1–3 and the comparative example. FIG. 22 is a graphic chart showing a radiation mode in the embodiments 1–3 and the comparative example. FIG. 23 is a graphic chart showing a guided mode in the embodiments 4–7. FIG. 24 is a graphic chart showing a radiation mode in the embodiment 4–7. FIG. 25 is a graphic chart showing a guided mode in the embodiments 1 and 8–10. FIG. 26 is a graphic chart showing a radiation mode in the embodiments 1 and 8–10. FIG. 27 is a graphic chart showing a guided mode in the embodiments 11–14. FIG. 28 is a graphic chart showing a radiation mode in the embodiments 11–14. FIG. 29 is a graphic chart showing a guided mode in the embodiments 15–18. FIG. 30 is a graphic chart showing a radiation mode in the embodiments 15–18. FIG. 31 is a graphic chart representing an effective range of carrier block layers, wherein the axis of the abscissa indicates a difference in Al composition, and the axis of ordinate indicates a thickness of the carrier block layers.

In FIG. 31, the anti-guiding function of the carrier block layers is too large, and disturbs the guided mode in an upper range from the right upper curve. Concretely, a reentrant is formed in the guided mode in the vicinity of the active layer. This brings about a decrease in the optical confinement factor, resulting in an increment in the threshold current. Further, it follows that the guided mode deviates largely from the Gaussian mode, and an aberration is caused in the radiation pattern. The carrier confinement is insufficient enough to worsen a temperature characteristic of the threshold current in a lower range from the left lower curve. The guiding function of the active layer is compensated most optimally by the carrier block layer to exhibit the best guided mode in a range where the following relationship is established:

$V_0/3<V_1<V_0$.

The embodiments falling within this range are marked with ⊙. (1) Represents the embodiment 1, and (2) indicates the embodiment 2. The circled numerals in the same Figure (FIG. 31) hereinafter similarly represent the embodiments corresponding to the numerals.

An effective range (exhibiting the effects) in the present invention is defined by the two solid lines.

The following is a technology common to the respective embodiment. Doping on the order of $1\times10^{18}/cm^3$ is conducted by use of Se as an n-type dopant and Zn as a p-type dopant. Zinc is diffused in a striped shape from the surface by use of an $SiO_2$ diffusion mask. Thereafter, a trial manufacture of a diode chip having a gain guiding structure is conducted by effecting a cleavage. After performing die-bonding to an LD mount, a light-current characteristic is measured in a pulse mode. Table 1 shows characteristic of the typical chip having a stripe width of 2.5 $\mu$m and a cavity length of 300 $\mu$m. Note that no optical coating is applied to both edge surfaces.

(Embodiment 1)

As illustrated in FIG. 2, an n-type buffer layer 10 having a thickness of 0.5 $\mu$m is formed on an n-type substrate 8 composed of GaAs. Formed sequentially on this layer are an n-type clad layer 1, an n-type light wave guide layer 2, an n-type carrier block layer 3, an active layer 4,-a p-type carrier block layer 5, a p-type light wave guide layer 6 and a p-type clad layer 7. An n-type cap layer 11 is formed as an uppermost layer thereon.

The following are concrete configurations of the respective layers.

n-type cap layer 11

Thickness: 0.3 $\mu$m

Composition: GaAs p-type clad layer 7

Thickness: 1.0 $\mu$m

Composition: $Al_{0.35}Ga_{0.65}As$ p-type light wave guide layer 6

Thickness: 0.46 $\mu$m

Composition: $Al_{0.30}Ga_{0.70}As$ n-type light wave guide layer 2

Thickness: 0.46 $\mu$m

Composition: $Al_{0.30}Ga_{0.70}As$ n-type clad layer 1

Thickness: 1.0 $\mu$m

Composition: $Al_{0.35}Ga_{0.65}As$ n-type buffer layer 10

Thickness: 0.5 $\mu$m

Composition: GaAs n-type substrate 8

Composition (100) GaAs

The active layer 4 as shown in exploded view is formed such that 4-layered quantum well layers 13 are each partitioned by barrier layers 14 between side barrier layers 12 deposited on inner walls of the respective carrier block layers 5, 3 in an area sandwiched in between p-type carrier block layer 5 and the n-type carrier block layer 3. The concrete configurations of this active layer 4 are given as follows:

p-type carrier block layer 5

Thickness: 165 angstrom

Composition: [$Al_{0.38}Ga_{0.62}As$] $Al_{0.50}Ga_{0.50}As$

Side barrier layer 12

Thickness: 25 angstrom

Composition: $Al_{0.30}Ga_{0.70}As$

Quantum well layer 13

Thickness: 55 angstrom

Composition: GaAs

Barrier layer 14

Thickness: 50 angstrom

Composition: $Al_{0.30}Ga_{0.70}As$ n-type carrier block layer 3

Thickness: 165 angstrom

Composition: [$Al_{0.38}Ga_{0.62}As$] $Al_{0.30}Ga_{0.50}As$

FIG. 21 illustrates a guided mode profile (near-field patterns) in the direction vertical to the epitaxy layer with respect to the structure shown in this embodiment. FIG. 22 shows a measured result in the radiation mode.

(Embodiment 2)

As illustrated in FIG. 3, the n-type buffer layer 10 having a thickness of 0.5 $\mu$m is formed on the n-type substrate 8 composed of GaAs. Formed sequentially on this layer are the n-type clad layer 1, the n-type light wave guide layer 2, the n-type carrier block layer 3, the active layer 4, the p-type carrier block layer 5, the p-type light wave guide layer 6 and the p-type clad layer 7. The n-type cap layer 11 is formed as an uppermost layer thereon.

The following are concrete configurations of the respective layers.

n-type cap layer 11

Thickness: 0.3 $\mu$m

Composition: GaAs p-type clad layer 7

Thickness: 2.0 $\mu$m

Composition: $Al_{0.31}Ga_{0.69}As$ p-type light wave guide layer 6

Thickness: 0.93 $\mu$m

Composition: $Al_{0.30}Ga_{0.70}As$ n-type light wave guide layer 2

Thickness: 0.93 $\mu$m

Composition: $Al_{0.31}Ga_{0.70}As$ n-type clad layer 1

Thickness: 2.0 $\mu$m

Composition: $Al_{0.31}Ga_{0.69}As$ n-type buffer layer 10

Thickness: 0.5 $\mu$m

Composition: GaAs n-type substrate 8

Composition (100) GaAs

The active layer 4 is formed such that 8-layered quantum well layers 13 are each partitioned by the barrier layers 14 as shown in exploded view between side barrier layers 12 deposited on the inner walls of the respective carrier block layers 5, 3 in an area sandwiched in between the p-type carrier block layer 5 and the n-type barrier layer 3. The concrete configurations of this active layer 4 are given as follows:

p-type carrier block layer 5

Thickness: 330 angstrom

Composition: $Al_{0.50}Ga_{0.50}As$

Side barrier layer 12

Thickness: 25 angstrom

Composition: $Al_{0.30}Ga_{0.70}As$

Quantum well layer 13

Thickness: 55 angstrom

Composition: GaAs

Barrier layer 14

Thickness: 50 angstrom

Composition: $Al_{0.30}Ga_{0.70}As$ n-type carrier block layer 3

Thickness: 330 angstrom

Composition: [$Al_{0.30}Ga_{0.70}As$] $Al_{0.50}Ga_{0.50}As$

FIG. 21 illustrates a guided mode profile (near-field pattern) in the direction vertical to the epitaxy layer with respect to the structure shown in this embodiment. FIG. 22 shows a measured result in the radiation mode.

(Embodiment 3)

As illustrated in FIG. 4, an n-type inversion layer 15 is provided between the p-type clad layer 7 and the p-type light wave guide layer 6. With the placement of this n-type inversion layer, the current can be narrowed down in the lateral direction in the vicinity of the active layer 4.

Namely, the light is confined also in the lateral direction owing to the n-type inversion layer 15, thereby making it possible to attain a stabilized off-axial mode.

n-type cap layer 11

Thickness: 0.3 $\mu$m

Composition: GaAs p-type clad layer 7

Thickness: 0.8 $\mu$m

Composition: $Al_{0.35}Ga_{0.65}As$ n-type inversion layer 15

Thickness: 0.2 $\mu$m

Composition: $Al_{0.35}Ga_{0.65}As$ p-type light wave guide layer 6

Thickness: 0.93 $\mu$m

Composition: $Al_{0.35}Ga_{0.70}As$ n-type light wave guide layer 2

Thickness: 0.93 $\mu$m

Composition: $Al_{0.30}Ga_{0.70}As$ n-type clad layer 1

Thickness: 1.0 $\mu$m

Composition: $Al_{0.35}Ga_{0.65}As$ n-type buffer layer 10

Thickness: 0.5 $\mu$m

Composition: GaAs n-type substrate 8

Composition (100) GaAs

The active layer 4 as shown in exploded view is formed such that the 8-layered quantum well layers 13 are each partitioned by the barrier layers 14 between the side barrier layers 12 deposited on the inner walls of the respective carrier block layers 5, 3 in the area sandwiched in between the p-type carrier block layer 5 and the n-type carrier block layer 3. The concrete configurations of this active layer 4 are given as follows:

p-type carrier block layer 5

Thickness: 330 angstrom

Composition: $Al_{0.50}Ga_{0.50}As$

Side barrier layer 12

Thickness: 25 angstrom

Composition: $Al_{0.30}Ga_{0.70}As$

Quantum well layer 13

Thickness: 55 angstrom

Composition: GaAs

Barrier layer 14

Thickness: 50 angstrom

Composition: $Al_{0.30}Ga_{0.70}As$ n-type carrier block layer 3

Thickness: 330 angstrom

Composition: $Al_{0.50}Ga_{0.50}As$

FIG. 21 illustrates a guided mode profile (near-field pattern) in the direction vertical to the epitaxy layer with respect to the structure shown in this embodiment. FIG. 22 shows a measured result in the radiation mode.

(Embodiment 4)

As illustrated in FIG. 6, the n-type buffer layer 10 having a thickness of 0.5 $\mu$m is formed on the n-type substrate 8 composed of GaAs. Formed sequentially on this layer are the n-type clad layer 1, the n-type light wave guide layer 2, the n-type carrier block layer 3, the active layer 4, the p-type carrier block layer 5, the p-type light wave guide layer 6 and the p-type clad layer 7. The n-type cap layer 11 is formed as an uppermost layer thereon.

The following are concrete configurations of the respective layers.

n-type cap layer 11

Thickness: 0.3 $\mu$m

Composition: GaAs p-type clad layer 7

Thickness: 1.0 $\mu$m

Composition: $Al_{0.35}Ga_{0.65}As$ p-type light wave guide layer 6

Thickness: 0.46 $\mu$m

Composition: $Al_{0.30}Ga_{0.70}As$ n-type light wave guide layer 2

Thickness: 0.46 $\mu$m

Composition: $Al_{0.30}Ga_{0.70}As$ n-type clad layer 1

Thickness: 1.0 $\mu$m

Composition: $Al_{0.35}Ga_{0.65}As$ n-type buffer layer 10

Thickness: 0.5 $\mu$m

Composition: GaAs n-type substrate 8

Composition (100) GaAs

The active layer 4 as shown in exploded view is formed such that the 4-layered quantum well layers 13 are each partitioned by the barrier layers 14 between the side barrier layers 12 deposited on the inner walls of the respective carrier block layers 5, 3 in the area sandwiched in between the p-type carrier block layer 5 and the n-type carrier block layer 3. The concrete configurations of this active layer 4 are given as follows:

p-type carrier block layer 5

Thickness: 100 angstrom

Composition: $Al_{0.38}Ga_{0.62}As$

Side barrier layer 12

Thickness: 25 angstrom

Composition: $Al_{0.30}Ga_{0.70}As$

Quantum well layer 13

Thickness: 55 angstrom

Composition: GaAs

Barrier layer 14

Thickness: 50 angstrom

Composition: $Al_{0.30}Ga_{0.70}As$ n-type carrier block layer 3

Thickness: 100 angstrom

Composition: $Al_{0.38}Ga_{0.62}As$

FIG. 23 illustrates a guided mode profile (near-field pattern) in the direction vertical to the epitaxy layer with respect to the structure shown in this embodiment. FIG. 24 shows a measured result in the radiation mode.

(Embodiment 5)

As illustrated in FIG. 6, the n-type buffer layer 10 having a thickness of 0.5 $\mu$m is formed on the n-type substrate 8 composed of GaAs. Formed sequentially on this layer are the n-type clad layer 1, the n-type light wave guide layer 2, the n-type carrier block layer 3, the active layer 4, the p-type carrier block layer 5, the p-type light wave guide layer 6 and the p-type clad layer 7. The n-type cap layer 11 is formed as an uppermost layer thereon.

The following are concrete configurations of the respective layers.

n-type cap layer 11

Thickness: 0.3 $\mu$m

Composition: GaAs p-type clad layer 7

Thickness: 1.0 $\mu$m

Composition: $Al_{0.35}Ga_{0.65}As$ p-type light wave guide layer 6

Thickness: 0.46 $\mu$m

Composition: $Al_{0.30}Ga_{0.70}As$ n-type light wave guide layer 2

Thickness: 0.46 $\mu$m

Composition: $Al_{0.35}Ga_{0.70}As$ n-type clad layer 1

Thickness: 1.0 $\mu$m

Composition: $Al_{0.35}Ga_{0.65}As$ n-type buffer layer 10

Thickness: 0.5 $\mu$m

Composition: GaAs n-type substrate 8

Composition (100) GaAs

The active layer 4 as shown in exploded view is formed such that the 4-layered quantum well layers 13 are each partitioned by the barrier layers 14 between the side barrier layers 12 deposited on the inner walls of the respective carrier block layers 5, 3 in the area sandwiched in between the p-type carrier block layer 5 and the n-type carrier block layer 3. The concrete configurations of this active layer 4 are given as follows:

p-type carrier block layer 5

Thickness: 200 angstrom

Composition: $Al_{0.38}Ga_{0.62}As$

Side barrier layer 12

Thickness: 25 angstrom

Composition: $Al_{0.30}Ga_{0.70}As$

Quantum well layer 13

Thickness: 55 angstrom

Composition: GaAs

Barrier layer 14

Thickness: 50 angstrom

Composition: $Al_{0.30}Ga_{0.70}As$ n-type carrier block layer 3

Thickness: 200 angstrom

Composition: $Al_{0.38}Ga_{0.62}As$

FIG. 23 illustrates a guided mode profile (near-field pattern) in the direction vertical to the epitaxy layer with respect to the structure shown in this embodiment. FIG. 24 shows a measured result in the radiation mode.

(Embodiment 6)

As illustrated in FIG. 7, the n-type buffer layer 10 having a thickness of 0.5 $\mu$m is formed on the n-type substrate 8 composed of GaAs. Formed sequentially on this layer are the n-type clad layer 1, the n-type light wave guide layer 2, the n-type carrier block layer 3, the active layer 4, the p-type carrier block layer 5, the p-type light wave guide layer 6 and the p-type clad layer 7. The n-type cap layer 11 is formed as an uppermost layer thereon.

The following are concrete configurations of the respective layers.

n-type cap layer 11

Thickness: 0.3 $\mu$m

Composition: GaAs p-type clad layer 7

Thickness: 1.0 $\mu$m

Composition: $Al_{0.35}Ga_{0.65}As$ p-type light wave guide layer 6

Thickness: 0.46 $\mu$m

Composition: $Al_{0.35}Ga_{0.70}As$ n-type light wave guide layer 2

Thickness: 0.46 $\mu$m

Composition: $Al_{0.30}Ga_{0.70}As$ n-type clad layer 1

Thickness: 1.0 $\mu$m

Composition: $Al_{0.35}Ga_{0.65}As$ n-type buffer layer 10

Thickness: 0.5 $\mu$m

Composition: GaAs n-type substrate 8

Composition (100) GaAs

The active layer 4 as shown in exploded view is formed such that the 4-layered quantum well layers 13 are each partitioned by the barrier layers 14 between the side barrier layers 12 deposited on the inner walls of the respective carrier block layers 5, 3 in the area sandwiched in between the p-type carrier block layer 5 and the n-type carrier block layer 3. The concrete configurations of this active layer 4 are given as follows:

p-type carrier block layer 5

Thickness: 330 angstrom

Composition: $Al_{0.38}Ga_{0.62}As$

Side barrier layer 12

Thickness: 25 angstrom

Composition: $Al_{0.30}Ga_{0.70}As$

Quantum well layer 13

Thickness: 55 angstrom

Composition: GaAs

Barrier layer 14

Thickness: 50 angstrom

Composition: $Al_{0.30}Ga_{0.70}As$ n-type carrier block layer 3

Thickness: 330 angstrom

Composition: $Al_{0.38}Ga_{0.62}As$

FIG. 23 illustrates a guided mode profile (near-field pattern) in the direction vertical to the epitaxy layer with respect to the structure shown in this embodiment. FIG. 24 shows a measured result in the radiation mode.

(Embodiment 7)

As illustrated in FIG. 8, the n-type buffer layer 10 having a thickness of 0.5 μm is formed on the n-type substrate 8 composed of GaAs. Formed sequentially on this layer are the n-type clad layer 1, the n-type light wave guide layer 2, the n-type carrier block layer 3, the active layer 4, the p-type carrier block layer 5, the p-type light wave guide layer 6 and the p-type clad layer 7. The n-type cap layer 11 is formed as an uppermost layer thereon.

The following are concrete configurations of the respective layers.

n-type cap layer 11
Thickness: 0.3 μm
Composition: GaAs
p-type clad layer 7
Thickness: 1.0 μm
Composition: $Al_{0.35}Ga_{0.65}As$
p-type light wave guide layer 6
Thickness: 0.46 μm
Composition: $Al_{0.30}Ga_{0.70}As$
n-type light wave guide layer 2
Thickness: 0.46 μm
Composition: $Al_{0.30}Ga_{0.70}As$
n-type clad layer 1
Thickness: 1.0 μm
Composition: $Al_{0.35}Ga_{0.65}As$
n-type buffer layer 10
Thickness: 0.5 μm
Composition: GaAs
n-type substrate 8
Composition (100) GaAs The active layer 4 as shown in exploded view is formed such that the 4-layered quantum well layers 13 are each partitioned by the barrier layers 14 between the side barrier layers 12 deposited on the inner walls of the respective carrier block layers 5, 3 in the area sandwiched in between the p-type carrier block layer 5 and the n-type carrier block layer 3. The concrete configurations of this active layer 4 are given as follows:

p-type carrier block layer 5
Thickness: 500 angstrom
Composition: $Al_{0.38}Ga_{0.62}As$
Side barrier layer 12
Thickness: 25 angstrom
Composition: $Al_{0.30}Ga_{0.70}As$
Quantum well layer 13
Thickness: 55 angstrom
Composition: GaAs
Barrier layer 14
Thickness: 50 angstrom
Composition: $Al_{0.30}Ga_{0.70}As$
n-type carrier block layer 3
Thickness: 500 angstrom
Composition: $Al_{0.38}Ga_{0.62}As$ FIG. 23 illustrates a guided mode profile (near-field pattern) in the direction vertical to the epitaxy layer with respect to the structure shown in this embodiment. FIG. 24 shows a measured result in the radiation mode.

(Embodiment 8)

As illustrated in FIG. 9, the n-type buffer layer 10 having a thickness of 0.5 μm is formed on the n-type substrate 8 composed of GaAs. Formed sequentially on this layer are the n-type clad layer 1, the n-type light wave guide layer 2, the n-type carrier block layer 3, the active layer 4, the p-type carrier block layer 5, the p-type light wave guide layer 6 and the p-type clad layer 7. The n-type cap layer 11 is formed as an uppermost layer thereon.

The following are concrete configurations of the respective layers.

n-type cap layer 11
Thickness: 0.3 μm
Composition: GaAs
p-type clad layer 7
Thickness: 1.0 μm
Composition: $Al_{0.35}Ga_{0.65}As$
p-type light wave guide layer 6
Thickness: 0.46 μm
Composition: $Al_{0.30}Ga_{0.70}As$
n-type light wave guide layer 2
Thickness: 0.46 μm
Composition: $Al_{0.30}Ga_{0.70}As$
n-type clad layer 1
Thickness: 1.0 μm
Composition: $Al_{0.35}Ga_{0.65}As$
n-type buffer layer 10
Thickness: 0.5 μm
Composition: GaAs
n-type substrate 8
Composition (100) GaAs The active layer 4 as shown in exploded view is formed such that the 4-layered quantum well layers 13 are each partitioned by the barrier layers 14 between the side barrier layers 12 deposited on the inner walls of the respective carrier block layers 5, 3 in the area sandwiched in between the p-type carrier block layer 5 and the n-type carrier block layer 3. The concrete configurations of this active layer 4 are given as follows:

p-type carrier block layer 5
Thickness: 50 angstrom
Composition: $Al_{0.50}Ga_{0.50}As$
Side barrier layer 12
Thickness: 25 angstrom
Composition: $Al_{0.30}Ga_{0.70}As$
Quantum well layer 13
Thickness: 55 angstrom
Composition: GaAs
Barrier layer 14
Thickness: 50 angstrom
Composition: $Al_{0.30}Ga_{0.70}As$
n-type carrier block layer 3
Thickness: 50 angstrom
Composition: [$Al_{0.30}Ga_{0.70}As$] $Al_{0.50}Ga_{0.50}As$ FIG. 25 illustrates a guided mode profile (near-field pattern) in the direction vertical to the epitaxy layer with respect to the structure shown in this embodiment. FIG. 26 shows a measured result in the radiation mode.

(Embodiment 9)

As illustrated in FIG. 10, the n-type buffer layer 10 having a thickness of 0.5 μm is formed on the n-type substrate 8 composed of GaAs. Formed sequentially on this layer are the n-type clad layer 1, the n-type light wave guide layer 2, the n-type carrier block layer 3, the active layer 4, the p-type carrier block layer 5, the p-type light wave guide layer 6 and the p-type clad layer 7. The n-type cap layer 11 is formed as an uppermost layer thereon.

The following are concrete configurations of the respective layers.

n-type cap layer 11

Thickness: 0.3 $\mu$m

Composition: GaAs p-type clad layer 7

Thickness: 1.0 $\mu$m

Composition: $Al_{0.35}Ga_{0.65}As$ p-type light wave guide layer 6

Thickness: 0.46 $\mu$m

Composition: $Al_{0.30}Ga_{0.70}As$ n-type light wave guide layer 2

Thickness: 0.46 $\mu$m

Composition: $Al_{0.30}Ga_{0.70}As$ n-type clad layer 1

Thickness: 1.0 $\mu$m

Composition: $Al_{0.35}Ga_{0.65}As$ n-type buffer layer 10

Thickness: 0.5 $\mu$m

Composition: GaAs n-type substrate 8

Composition (100) GaAs

The active layer 4 as shown in exploded view is formed such that the 4-layered quantum well layers 13 are each partitioned by the barrier layers 14 between the side barrier layers 12 deposited on the inner walls of the respective carrier block layers 5, 3 in the area sandwiched in between the p-type carrier block layer 5 and the n-type carrier block layer 3. The concrete configurations of this active layer 4 are given as follows:

p-type carrier block layer 5

Thickness: 330 angstrom

Composition: $Al_{0.50}Ga_{0.50}As$

Side barrier layer 12

Thickness: 25 angstrom

Composition: $Al_{0.30}Ga_{0.70}As$

Quantum well layer 13

Thickness: 55 angstrom

Composition: GaAs

Barrier layer 14

Thickness: 50 angstrom

Composition: $Al_{0.30}Ga_{0.70}As$ n-type carrier block layer 3

Thickness: 330 angstrom

Composition: $Al_{0.50}Ga_{0.50}As$

FIG. 25 illustrates a guided mode profile (near-field pattern) in the direction vertical to the epitaxy layer with respect to the structure shown in this embodiment. FIG. 26 shows a measured result in the radiation mode.

(Embodiment 10)

As illustrated in FIG. 11, the n-type buffer layer 10 having a thickness of 0.5 $\mu$m is formed on the n-type substrate 8 composed of GaAs. Formed sequentially on this layer are the n-type clad layer 1, the n-type light wave guide layer 2, the n-type carrier block layer 3, the active layer 4, the p-type carrier block layer 5, the p-type light wave guide layer 6 and the p-type clad layer 7. The n-type cap layer 11 is formed as an uppermost layer thereon.

The following are concrete configurations of the respective layers.

n-type cap layer 11

Thickness: 0.3 $\mu$m

Composition: GaAs p-type clad layer 7

Thickness: 1.0 $\mu$m

Composition: $Al_{0.35}Ga_{0.65}As$ p-type light wave guide layer 6

Thickness: 0.46 $\mu$m

Composition: $Al_{0.30}Ga_{0.70}As$ n-type light wave guide layer 2

Thickness: 0.46 $\mu$m

Composition: $Al_{0.30}Ga_{0.70}As$ n-type clad layer 1

Thickness: 1.0 $\mu$m

Composition: $Al_{0.35}Ga_{0.65}As$ n-type buffer layer 10

Thickness: 0.5 $\mu$m

Composition: GaAs n-type substrate 8

Composition (100) GaAs

The active layer 4 as shown in exploded view is formed such that the 4-layered quantum well layers 13 are each partitioned by the barrier layers 14 between the side barrier layers 12 deposited on the inner walls of the respective carrier block layers 5, 3 in the area sandwiched in between the p-type carrier block layer 5 and the n-type carrier block layer 3. The concrete configurations of this active layer 4 are given as follows:

p-type carrier block layer 5

Thickness: 500 angstrom

Composition: $Al_{0.50}Ga_{0.50}As$

Side barrier layer 12

Thickness: 25 angstrom

Composition: $Al_{0.30}Ga_{0.70}As$

Quantum well layer 13

Thickness: 55 angstrom

Composition: GaAs

Barrier layer 14

Thickness: 50 angstrom

Composition: $Al_{0.30}Ga_{0.70}As$ n-type carrier block layer 3

Thickness: 500 angstrom

Composition: $Al_{0.50}Ga_{0.50}As$

FIG. 25 illustrates a guided mode profile (near-field pattern) in the direction vertical to the epitaxy layer with respect to the structure shown in this embodiment. FIG. 26 shows a measured result in the radiation mode.

(Embodiment 11)

As illustrated in FIG. 12, the n-type buffer layer 10 having a thickness of 0.5 $\mu$m is formed on the n-type substrate 8 composed of GaAs. Formed sequentially on this layer are the n-type clad layer 1, the n-type light wave guide layer 2, the n-type carrier block layer 3, the active layer 4, the p-type carrier block layer 5, the p-type light wave guide layer 6 and the p-type clad layer 7. The n-type cap layer 11 is formed as an uppermost layer thereon.

The following are concrete configurations of the respective layers.

n-type cap layer 11

Thickness: 0.3 μm

Composition: GaAs p-type clad layer 7

Thickness: 1.0 μm

Composition: $Al_{0.35}Ga_{0.65}As$ p-type light wave guide layer 6

Thickness: 0.46 μm

Composition: $Al_{0.25}Ga_{0.75}As$ n-type light wave guide layer 2

Thickness: 0.46 μm

Composition: $Al_{0.25}Ga_{0.75}As$ n-type clad layer 1

Thickness: 1.0 μm

Composition: $Al_{0.35}Ga_{0.65}As$ n-type buffer layer 10

Thickness: 0.5 μm

Composition: GaAs n-type substrate 8

Composition (100) GaAs

The active layer 4 as shown in exploded view is formed such that the 4-layered quantum well layers 13 are each partitioned by the barrier layers 14 between the side barrier layers 12 deposited on the inner walls of the respective carrier block layers 5, 3 in the area sandwiched in between the p-type carrier block layer 5 and the n-type carrier block layer 3. The concrete configurations of this active layer 4 are given as follows:

p-type carrier block layer 5

Thickness: 50 angstrom

Composition: $Al_{0.50}Ga_{0.50}As$

Side barrier layer 12

Thickness: 25 angstrom

Composition: $Al_{0.25}Ga_{0.75}As$

Quantum well layer 13

Thickness: 55 angstrom

Composition: GaAs

Barrier layer 14

Thickness: 50 angstrom

Composition: $Al_{0.25}Ga_{0.75}As$ n-type carrier block layer 3

Thickness: 50 angstrom

Composition: $Al_{0.50}Ga_{0.50}As$

FIG. 27 illustrates a guided mode profile (near-field pattern) in the direction vertical to the epitaxy layer with respect to the structure shown in this embodiment. FIG. 28 shows a measured result in the radiation mode.

(Embodiment 12)

As illustrated in FIG. 13, the n-type buffer layer 10 having a thickness of 0.5 μm is formed on the n-type substrate 8 composed of GaAs. Formed sequentially on this layer are the n-type clad layer 1, the n-type light wave guide layer 2, the n-type carrier block layer 3, the active layer 4, the p-type carrier block layer 5, the p-type light wave guide layer 6 and the p-type clad layer 7. The n-type cap layer 11 is formed as an uppermost layer thereon.

The following are concrete configurations of the respective layers.

n-type cap layer 11

Thickness: 0.3 μm

Composition: GaAs p-type clad layer 7

Thickness: 1.0 μm

Composition: $Al_{0.35}Ga_{0.65}As$ p-type light wave guide layer 6

Thickness: 0.46 μm

Composition: $Al_{0.25}Ga_{0.75}As$ n-type light wave guide layer 2

Thickness: 0.46 μm

Composition: $Al_{0.25}Ga_{0.75}As$ n-type clad layer 1

Thickness: 1.0 μm

Composition: $Al_{0.35}Ga_{0.65}As$ n-type buffer layer 10

Thickness: 0.5 μm

Composition: GaAs n-type substrate 8

Composition (100) GaAs

The active layer 4 as shown in exploded view is formed such that the 4-layered quantum well layers 13 are each partitioned by the barrier layers 14 between the side barrier layers 12 deposited on the inner walls of the respective carrier block layers 5, 3 in the area sandwiched in between the p-type carrier block layer 5 and the n-type carrier block layer 3. The concrete configurations of this active layer 4 are given as follows:

p-type carrier block layer 5

Thickness: 135 angstrom

Composition: $Al_{0.50}Ga_{0.50}As$

Side barrier layer 12

Thickness: 25 angstrom

Composition: $Al_{0.25}Ga_{0.75}As$

Quantum well layer 13

Thickness: 55 angstrom

Composition: GaAs

Barrier layer 14

Thickness: 50 angstrom

Composition: $Al_{0.25}Ga_{0.75}As$ n-type carrier block layer 3

Thickness: 135 angstrom

Composition: $Al_{0.50}Ga_{0.50}As$

FIG. 27 illustrates a guided mode profile (near-field pattern) in the direction vertical to the epitaxy layer with respect to the structure shown in this embodiment. FIG. 28 shows a measured result in the radiation mode.

(Embodiment 13)

As illustrated in FIG. 14, the n-type buffer layer 10 having a thickness of 0.5 μm is formed on the n-type substrate 8 composed of GaAs. Formed sequentially on this layer are the n-type clad layer 1, the n-type light wave guide layer 2, the n-type carrier block layer 3, the active layer 4, the p-type carrier block layer 5, the p-type light wave guide layer 6 and the p-type clad layer 7. The n-type cap layer 11 is formed as an uppermost layer thereon.

The following are concrete configurations of the respective layers.

n-type cap layer 11

Thickness: 0.3 μm

Composition: GaAs p-type clad layer 7

Thickness: 1.0 μm

Composition: $Al_{0.35}Ga_{0.65}As$ p-type light wave guide layer 6

Thickness: 0.46 μm

Composition: $Al_{0.25}Ga_{0.75}As$ n-type light wave guide layer 2

Thickness: 0.46 μm

Composition: $Al_{0.25}Ga_{0.75}As$ n-type clad layer 1

Thickness: 1.0 μm

Composition: $Al_{0.35}Ga_{0.65}As$ n-type buffer layer 10

Thickness: 0.5 μm

Composition: GaAs n-type substrate 8

Composition (100) GaAs

The active layer 4 as shown in exploded view is formed such that the 4-layered quantum well layers 13 are each partitioned by the barrier layers 14 between the side barrier layers 12 deposited on the inner walls of the respective carrier block layers 5, 3 in the area sandwiched in between the p-type carrier block layer 5 and the n-type carrier block layer 3. The concrete configurations of this active layer 4 are given as follows:

p-type carrier block layer 5

Thickness: 200 angstrom

Composition: $Al_{0.50}Ga_{0.50}As$

Side barrier layer 12

Thickness: 25 angstrom

Composition: $Al_{0.25}Ga_{0.75}As$

Quantum well layer 13

Thickness: 55 angstrom

Composition: GaAs

Barrier layer 14

Thickness: 50 angstrom

Composition: $Al_{0.25}Ga_{0.75}As$ n-type carrier block layer 3

Thickness: 200 angstrom

Composition: $Al_{0.50}Ga_{0.50}As$

FIG. 27 illustrates a guided mode profile (near-field pattern) in the direction vertical to the epitaxy layer with respect to the structure shown in this embodiment. FIG. 28 shows a measured result in the radiation mode.

(Embodiment 14)

As illustrated in FIG. 15, the n-type buffer layer 10 having a thickness of 0.5 μm is formed on the n-type substrate 8 composed of GaAs. Formed sequentially on this layer are the n-type clad layer 1, the n-type light wave guide layer 2, the n-type carrier block layer 3, the active layer 4, the p-type carrier block layer 5, the p-type light wave guide layer 6 and the p-type clad layer 7. The n-type cap layer 11 is formed as an uppermost layer thereon.

The following are concrete configurations of the respective layers.

n-type cap layer 11

Thickness: 0.3 μm

Composition: GaAs p-type clad layer 7

Thickness: 1.0 μm

Composition: $Al_{0.35}Ga_{0.65}As$ p-type light wave guide layer 6

Thickness: 0.46 μm

Composition: $Al_{0.25}Ga_{0.75}As$ n-type light wave guide layer 2

Thickness: 0.46 μm

Composition: $Al_{0.25}Ga_{0.75}As$ n-type clad layer 1

Thickness: 1.0 μm

Composition: $Al_{0.35}Ga_{0.65}As$ n-type buffer layer 10

Thickness: 0.5 μm

Composition: GaAs n-type substrate 8

Composition (100) GaAs

The active layer 4 as shown in exploded view is formed such that the 4-layered quantum well layers 13 are each partitioned by the barrier layers 14 between the side barrier layers 12 deposited on the inner walls of the respective carrier block layers 5, 3 in the area sandwiched in between the p-type carrier block layer 5 and the n-type carrier block layer 3. The concrete configurations of this active layer 4 are given as follows:

p-type carrier block layer 5

Thickness: 330 angstrom

Composition: $Al_{0.50}Ga_{0.50}As$

Side barrier layer 12

Thickness: 25 angstrom

Composition: $Al_{0.25}Ga_{0.75}As$

Quantum well layer 13

Thickness: 55 angstrom

Composition: GaAs

Barrier layer 14

Thickness: 50 angstrom

Composition: $Al_{0.25}Ga_{0.75}As$ n-type carrier block layer 3

Thickness: 330 angstrom

Composition: $Al_{0.50}Ga_{0.50}As$

FIG. 27 illustrates a guided mode profile (near-field pattern) in the direction vertical to the epitaxy layer with respect to the structure shown in this embodiment. FIG. 28 shows a measured result in the radiation mode.

(Embodiment 15)

As illustrated in FIG. 16, the n-type buffer layer 10 having a thickness of 0.5 μm is formed on the n-type substrate 8 composed of GaAs. Formed sequentially on this layer are the n-type clad layer 1, the n-type light wave guide layer 2, the n-type carrier block layer 3, the active layer 4, the p-type carrier block layer 5, the p-type light wave guide layer 6 and the p-type clad layer 7. The n-type cap layer 11 is formed as an uppermost layer thereon.

The following are concrete configurations of the respective layers.

n-type cap layer 11

Thickness: 0.3 μm

Composition: GaAs p-type clad layer 7

Thickness: 1.0 μm

Composition: $Al_{0.35}Ga_{0.65}As$ p-type light wave guide layer 6

Thickness: 0.46 μm

Composition: $Al_{0.25}Ga_{0.75}As$ n-type light wave guide layer 2

Thickness: 0.46 μm

Composition: $Al_{0.25}Ga_{0.75}As$ n-type clad layer 1

Thickness: 1.0 μm

Composition: $Al_{0.35}Ga_{0.65}As$ n-type buffer layer 10

Thickness: 0.5 μm

Composition: GaAs n-type substrate 8

Composition (100) GaAs

The active layer 4 as shown in exploded view is formed such that the 4-layered quantum well layers 13 are each partitioned by the barrier layers 14 between the side barrier layers 12 deposited on the inner walls of the respective carrier block layers 5, 3 in the area sandwiched in between the p-type carrier block layer 5 and the n-type carrier block layer 3. The concrete configurations of this active layer 4 are given as follows:

p-type carrier block layer 5

Thickness: 50 angstrom

Composition: $Al_{0.65}Ga_{0.35}As$

Side barrier layer 12

Thickness: 25 angstrom

Composition: $Al_{0.25}Ga_{0.75}As$

Quantum well layer 13

Thickness: 55 angstrom

Composition: GaAs

Barrier layer 14

Thickness: 50 angstrom

Composition: $Al_{0.25}Ga_{0.75}As$ n-type carrier block layer 3

Thickness: 50 angstrom

Composition: $Al_{0.65}Ga_{0.35}As$

FIG. 29 illustrates a guided mode profile (near-field pattern) in the direction vertical to the epitaxy layer with respect to the structure shown in this embodiment. FIG. 30 shows a measured result in the radiation mode.

(Embodiment 16)

As illustrated in FIG. 17, the n-type buffer layer 10 having a thickness of 0.5 μm is formed on the n-type substrate 8 composed of GaAs. Formed sequentially on this layer are the n-type clad layer 1, the n-type light wave guide layer 2, the n-type carrier block layer 3, the active layer 4, the p-type carrier block layer 5, the p-type light wave guide layer 6 and the p-type clad layer 7. The n-type cap layer 11 is formed as an uppermost layer thereon.

The following are concrete configurations of the respective layers.

n-type cap layer 11

Thickness: 0.3 μm

Composition: GaAs p-type clad layer 7

Thickness: 1.0 μm

Composition: $Al_{0.35}Ga_{0.65}As$ p-type light wave guide layer 6

Thickness: 0.46 μm

Composition: $Al_{0.25}Ga_{0.75}As$ n-type light wave guide layer 2

Thickness: 0.46 μm

Composition: $Al_{0.25}Ga_{0.75}As$ n-type clad layer 1

Thickness: 1.0 μm

Composition: $Al_{0.35}Ga_{0.65}As$ n-type buffer layer 10

Thickness: 0.5 μm

Composition: GaAs n-type substrate 8

Composition (100) GaAs

The active layer 4 as shown in exploded view is formed such that the 4-layered quantum well layers 13 are each partitioned by the barrier layers 14 between the side barrier layers 12 deposited on the inner walls of the respective carrier block layers 5, 3 in the area sandwiched in between the p-type carrier block layer 5 and the n-type carrier block layer 3. The concrete configurations of this active layer 4 are given as follows:

p-type carrier block layer 5

Thickness: 100 angstrom

Composition: [$Al_{0.35}Ga_{0.65}As$] $Al_{0.65}Ga_{0.35}As$

Side barrier layer 12

Thickness: 25 angstrom

Composition: $Al_{0.25}Ga_{0.75}As$

Quantum well layer 13

Thickness: 55 angstrom

Composition: GaAs

Barrier layer 14

Thickness: 50 angstrom

Composition: $Al_{0.25}Ga_{0.75}As$ n-type carrier block layer 3

Thickness: 100 angstrom

Composition: [$Al_{0.35}Ga_{0.65}As$] $Al_{0.65}Ga_{0.35}As$

FIG. 29 illustrates a guided mode profile (near-field pattern) in the direction vertical to the epitaxy layer with respect to the structure shown in this embodiment. FIG. 30 shows a measured result in the radiation mode.

(Embodiment 17)

As illustrated in FIG. 18, the n-type buffer layer 10 having a thickness of 0.5 μm is formed on the n-type substrate 8 composed of GaAs. Formed sequentially on this layer are the n-type clad layer 1, the n-type light wave guide layer 2, the n-type carrier block layer 3, the active layer 4, the p-type carrier block layer 5, the p-type light wave guide layer 6 and the p-type clad layer 7. The n-type cap layer 11 is formed as an uppermost layer thereon.

The following are concrete configurations of the respective layers.

n-type cap layer 11

Thickness: 0.3 μm

Composition: GaAs p-type clad layer 7

Thickness: 1.0 μm

Composition: $Al_{0.35}Ga_{0.65}As$ p-type light wave guide layer 6

Thickness: 0.46 μm

Composition: $Al_{0.25}Ga_{0.75}As$ n-type light wave guide layer 2

Thickness: 0.46 μm

Composition: $Al_{0.25}Ga_{0.75}As$ n-type clad layer 1

Thickness: 1.0 μm

Composition: $Al_{0.35}Ga_{0.65}As$ n-type buffer layer 10

Thickness: 0.5 μm

Composition: GaAs n-type substrate 8

Composition (100) GaAs

The active layer 4 as shown in exploded view is formed such that the 4-layered quantum well layers 13 are each partitioned by the barrier layers 14 between the side barrier layers 12 deposited on the inner walls of the respective carrier block layers 5, 3 in the area sandwiched in between the p-type carrier block layer 5 and the n-type carrier block layer 3. The concrete configurations of this active layer 4 are given as follows:

p-type carrier block layer 5

Thickness: 200 angstrom

Composition: $Al_{0.65}Ga_{0.35}As$

Side barrier layer 12

Thickness: 25 angstrom

Composition: $Al_{0.25}Ga_{0.75}As$

Quantum well layer 13

Thickness: 55 angstrom

Composition: GaAs

Barrier layer 14

Thickness: 50 angstrom

Composition: $Al_{0.25}Ga_{0.75}As$ n-type carrier block layer 3

Thickness: 200 angstrom

Composition: $Al_{0.65}Ga_{0.35}As$

FIG. 29 illustrates a guided mode profile (near-field pattern) in the direction vertical to the epitaxy layer with respect to the structure shown in this embodiment. FIG. 30 shows a measured result in the radiation mode.

(Embodiment 18)

As illustrated in FIG. 19, the n-type buffer layer 10 having a thickness of 0.5 $\mu$m is formed on the n-type substrate 8 composed of GaAs. Formed sequentially on this layer are the n-type clad layer 1, the n-type light wave guide layer 2, the n-type carrier block layer 3, the active layer 4, the p-type carrier block layer 5, the p-type light wave guide layer 6 and the p-type clad layer 7. The n-type cap layer 11 is formed as an uppermost layer thereon.

The following are concrete configurations of the respective layers.

n-type cap layer 11

Thickness: 0.3 $\mu$m

Composition: GaAs p-type clad layer 7

Thickness: 1.0 $\mu$m

Composition: $Al_{0.35}Ga_{0.65}As$ p-type light wave guide layer 6

Thickness: 0.46 $\mu$m

Composition: $Al_{0.25}Ga_{0.75}As$ n-type light wave guide layer 2

Thickness: 0.46 $\mu$m

Composition: $Al_{0.25}Ga_{0.75}As$ n-type clad layer 1

Thickness: 1.0 $\mu$m

Composition: $Al_{0.35}Ga_{0.65}As$ n-type buffer layer 10

Thickness: 0.5 $\mu$m

Composition: GaAs n-type substrate 8

Composition (100) GaAs

The active layer 4 as shown in exploded view is formed such that the 4-layered quantum well layers 13 are each partitioned by the barrier layers 14 between the side barrier layers 12 deposited on the inner walls of the respective carrier block layers 5, 3 in the area sandwiched in between the p-type carrier block layer 5 and the n-type carrier block layer 3. The concrete configurations of this active layer 4 are given as follows:

p-type carrier block layer 5

Thickness: 280 angstrom

Composition: $Al_{0.65}Ga_{0.35}As$

Side barrier layer 12

Thickness: 25 angstrom

Composition: $Al_{0.25}Ga_{0.75}As$

Quantum well layer 13

Thickness: 55 angstrom

Composition: GaAs

Barrier layer 14

Thickness: 50 angstrom

Composition: $Al_{0.25}Ga_{0.75}As$ n-type carrier block layer 3

Thickness: 280 angstrom

Composition: $Al_{0.65}Ga_{0.35}As$

FIG. 29 illustrates a guided mode profile (near-field pattern) in the direction vertical to the epitaxy layer with respect to the structure shown in this embodiment. FIG. 30 shows a measured result in the radiation mode.

(Comparative Example)

FIG. 20 is a schematic plan view showing a composition of a quantum well type laser element based on a conventional structure which is manufactured for comparisons with the above-mentioned Embodiments 1–18.

The following are concrete configurations of the respective layers, n-type cap layer 11

Thickness: 0.3 $\mu$m

Composition: GaAs p-type clad layer 7

Thickness: 1.5 $\mu$m

Composition: $Al_{0.65}Ga_{0.35}As$ n-type clad layer 1

Thickness: 1.5 $\mu$m

Composition: $Al_{0.65}Ga_{0.35}As$ n-type buffer layer 10

Thickness: 0.5 $\mu$m

Composition: GaAs n-type substrate 8

Composition (100) GaAs

The active layer 4 as shown in exploded view is formed such that 4-layered quantum well layers 13 are partitioned by barrier layers 14 in an area sandwiched in between side barrier layers 12. The concrete configurations of this active layer 4 are given as follows:

Side barrier layer 12

Thickness: 120 angstrom

Composition: $Al_{0.30}Ga_{0.70}As$

Quantum well layer 13

Thickness: 50 angstrom

Composition: GaAs

Barrier layer 14

Thickness: 50 angstrom

Composition: $Al_{0.30}Ga_{0.70}As$

FIG. 21 illustrates a guided mode profile (near-field pattern) in the direction vertical to the epitaxy layer with respect to the structure shown in this embodiment. FIG. 22 shows a measured result in the radiation mode.

As obvious from FIG. 21, the weakly guiding semiconductor laser exhibits a center-pointed characteristic curve having exponential function tails on both sides. In contrast, the Embodiments 1–18 exhibit characteristic forms similar to a Gaussian beam. For this reason, using the semiconductor laser in the present embodiment decreases the beam intensity in the active layer 4 (mode center), as shown in FIG. 21, where an optical damage is caused even with a mode expansion to the same extent as that in the prior arts. As shown by the measured results in Table 1 which follows, a level of the catastrophic optical damage (COD) can be remarkably raised. Namely, a reduction in radiation angle and a remarkable improvement in the level of the optical damage in the present embodiments 1–3 become more apparent than in the comparative example. Note that an emission wavelength (angstrom) of the laser is approximately 8000 angstrom in Table 1. Further, the optical damage level and the slope efficiency are each optical outputs per edge surface.

TABLE 1

| LD TYPE | NORMALIZED FREQUENCY | RADIATION ANGLE $\Theta\perp\Theta\parallel$ | COD LEVEL (mW) | THRESHOLD CURRENT (mA) | SLOFE EFFICIENCY (mW/mA) |
|---|---|---|---|---|---|
| EMBODIMENT I | 1.6 | 25° | 250 | 90 | 0.5 |
| STRUTURE IN FIG. 2 | | 5° | | | |
| EMBODIMENT 2 | 1.6 | 14° | 500 | 300 | 0.5 |
| STRUCTURE IN FIG. 3 | | 4° | | | |
| EMBODIMENT 3 | 3.5 | 18° | 400 | 250 | 0.5 |
| STRUCTURE IN FIG. 4 | | 5° | | | |
| COMPARATIVE EXAMPLE | 0.28 | 22° | 100 | 75 | 0.4 |
| STRUCTURE IN FIG. 20 | | 8° | | | |

Industrial Applicability

In the industrial fields where the high-output semiconductor laser is employed for communications, optical recording on optical disks or the like, laser printers, laser medical treatments and laser machining, etc. according to the present invention, the high-efficiency semiconductor laser exhibiting a good beam profile at the low radiation beam angle can be obtained. Besides, it is possible to manufacture the high-output semiconductor laser by avoiding the concurrent optical damage of the edge surface with a simple structure. Especially in the $Al_xGa_{1-x}As$ semiconductor laser, the Al composition of the wave guide layer can be reduced, thereby facilitating the manufacturing process.

For this reason, the element of the present invention can be utilized in the form of the high-efficiency semiconductor laser device. Furthermore, the semiconductor laser can be used as an excitation source of a solid-state laser. The solid-state laser may involve the use of laser mediums such as Nd:YAG and Nd:YLF. If the semiconductor laser is employed as an excitation source of the solid-state laser, the problem is a method of connecting the semiconductor laser to the laser medium. Generally, excitation beams from the semiconductor laser are focused at a high efficiency through such a lens as to mode-match an excitation volume of the semiconductor laser with a mode volume of the laser oscillator.

Figure 32:
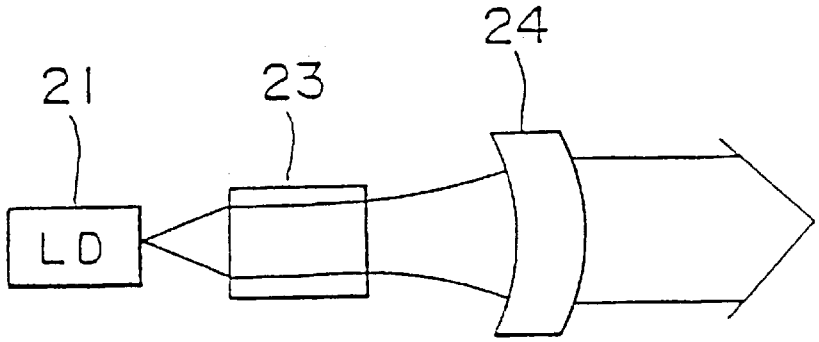
FIG. 32 is a view illustrating a direct-connection type semiconductor laser excitation solid-state laser device utilizing the laser element according to this invention.
Figure 33:
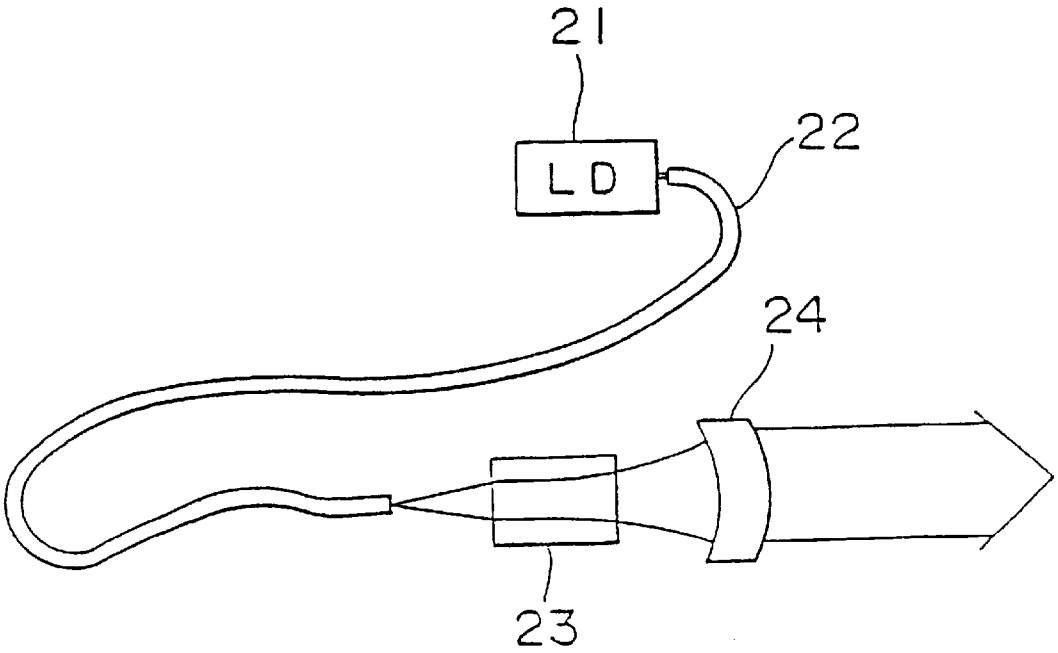
FIG. 33 is a view illustrating an example of a fiber connection type semiconductor laser excitation solid-state laser device utilizing the laser element according to this invention.

In the laser element according to this invention, the beams may be focused by use of the lens as described above. As illustrated in FIGS. 32 and 33, the excitation beams from a semiconductor laser element 21 can be made to strike on a laser medium 23 without effecting any optical processing on the excitation beams from the semiconductor laser element 21. Incidentally, the numeral 24 designates an output mirror. Note that FIG. 32 shows a direct-connection type wherein the semiconductor laser element 21 is connected directly to the laser medium 23, while FIG. 33 illustrates a fiber connection type semiconductor laser excitation solid-state laser device in which the semiconductor laser element 21 is connected via an optical fiber 22 to the laser medium 23.

What is claimed is:

1. A semiconductor laser element including an active layer having a light guiding function comprising:

a pair of carrier block layers sandwiching said active layer, for reducing the light guiding function of said active layer, a pair of wave guide layers sandwiching said pair of carrier block layers, and a pair of clad layers sandwiching said pair of wave guide layers, wherein $V_2$ corresponding to the normalized frequency of the wave guide layer is in the range of $\pi/4$–$\pi$, and is defined by $$V_2=(\pi d_2/\lambda)\cdot(N_0^2-N_3^2)^{0.5}$$

where $\pi$ is the ratio of the circumference of a circle to its diameter, $d_2$ is the effective thickness between said two clad layers, $\lambda$ is the oscillation wave length, $N_0$ is the effective refractive index of said wave guide layer, and $N_3$ is the refractive index of said clad layer.

2. The semiconductor laser element according to claim 1, wherein the bandgap profile along the vertical direction of said wave guide layer is a planar or spherical oblique bandgap which becomes narrower with closer proximity to said carrier block layers from the horizontal exterior section.

3. The semiconductor laser element according to claims 1 or 2, wherein $V_1$ relative to the normalized frequency V in a guided mode are defined by:

$$V_1=\pi\cdot d_1/\lambda\cdot(N_0^2-N_2^2)^{0.5}$$

where $\pi$ is the ratio of the circumference of a circle to its diameter, $d_1$ is the thickness of said carrier block layer, $\lambda$ is the oscillation wavelength, $N_2$ is the refractive index of said carrier block layer, wherein the relationship of $V_1<V_2/10$ is established.

4. The semiconductor laser element according to claim 3, wherein an energy gap difference E (eV) between said wave guide layer and said carrier block layer is given by:

$$E>(2.5\cdot10^3/d_1^2)$$

where $d_1$ (angstrom) is the thickness of said carrier block layer.

5. The semiconductor laser element according to claim 4, wherein $Al_xGa_{1-x}As(0 \leqq x<1)$ is employed, and the composition of said wave guide layer is:

$$Al_xGa_{1-x}As(0 \leqq x<0.35).$$

6. The semiconductor layer element according to claim 4, wherein $V_0$ is given by:

$$V_0=\pi \cdot d_0/\lambda \cdot (N_1^2-N_0^2)^{0.5}$$

where $d_0$ is the thickness of said active layer, when said active layer is a quantum well, $V_0$ is defined as $$V_0=N \cdot \pi \cdot d_w/\lambda(N_1^2-N_0^2)^{0.3}$$

where $d_w$ is the thickness of said quantum well layer, $N_1$ is the refractive index of said quantum well layer, $N_0$ is the refractive index of said wave guide layer, and N is the number of said quantum wells, and a relationship of [$(V_0/3)<V_1<5V_0$] $(V_0/3)<V_1<V_0$ is established.

7. A laser device using said semiconductor laser element according to any *one* of claims 1, [or] 2 *or 12*.

8. A semiconductor laser excitation solid-state laser device using said semiconductor laser element according to any *one* of claims 1, [or] 2 *or 12*, as a laser excitation light source.

9. The semiconductor laser excitation solid-state laser device according to claim 8, wherein the excitation light outputted from said laser element enters a solid-state laser without employing a lens.

10. The semiconductor laser element according to claim 1, wherein the refractive index of said wave guide layer increases monotonously with approaching carrier block layer.

11. The semiconductor laser element according to claim 5, wherein the relationship between $\Delta x$ and $d_1$ (angstrom) falls within the following range $$2.2 \cdot 10^3/d_1^2<\Delta x<5.0 \cdot 10^4/d_1^2$$

where $\Delta x$ is aluminum composition difference between said carrier block layer ($x_1$) and said wave guide layer ($x_2$);

($\Delta x=x_1-x_2$), and $d_1$ is the thickness of said carrier block layer.

*12. A semiconductor laser element including an active layer having a light guiding function comprising:*

*a pair of carrier block layers sandwiching said active layer, for reducing the light guiding function of said active layer,*

*a pair of wave guide layers sandwiching said pair of carrier block layers, and*

*a pair of clad layers sandwiching said pair of wave guide layers,*

*wherein $V_1$ relative to the normalized frequency V in a guided mode are defined by:*

$$V_1=\pi \cdot d_1/\lambda \cdot (N_0^2-N_2^2)0.5$$

*and $V_2$ corresponding to the normalized frequency of the waveguide layer is defined by:*

$$V_2=\pi \cdot d_2/\lambda) \cdot (N_2^2-N_3^2)^{0.5}$$

*where $\pi$ is the ratio of the circumference of a circle to its diameter, $d_1$ is the thickness of said carrier block layer, $\lambda$ is the oscillation wavelength, $N_2$ is the refractive index of said carrier block layer, $d_2$ is the effective thickness between said two clad layers, $N_0$ is the effective refractive index of said wave guide layer, and $N_3$ is the refractive index of said clad layer, wherein the relationship of $V_1<V_2/10$ is established.*

* * * * *